United States Patent
Nishikizawa et al.

(10) Patent No.: US 10,522,446 B2
(45) Date of Patent: Dec. 31, 2019

(54) SEMICONDUCTOR DEVICE AND MANUFACTURING METHOD OF THE SAME

(71) Applicant: Renesas Electronics Corporation, Tokyo (JP)

(72) Inventors: Atsushi Nishikizawa, Gunma (JP); Tadatoshi Danno, Gunma (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/715,544

(22) Filed: Sep. 26, 2017

(65) Prior Publication Data

US 2018/0151479 A1 May 31, 2018

(30) Foreign Application Priority Data

Nov. 25, 2016 (JP) ................................ 2016-229032

(51) Int. Cl.
*H01L 23/495* (2006.01)
*H01L 21/56* (2006.01)
(Continued)

(52) U.S. Cl.
CPC ...... *H01L 23/49513* (2013.01); *H01L 21/565* (2013.01); *H01L 23/49555* (2013.01); *H01L 23/49582* (2013.01); *H01L 24/29* (2013.01); *H01L 24/32* (2013.01); *H01L 24/48* (2013.01); *H01L 24/73* (2013.01); *H01L 24/83* (2013.01); *H01L 24/85* (2013.01); *H01L 24/92* (2013.01); *H01L 23/3107* (2013.01); *H01L 23/3121* (2013.01); *H01L 24/45* (2013.01);
(Continued)

(58) Field of Classification Search
CPC .......... H01L 23/49513; H01L 23/3121; H01L 24/29; H01L 24/73; H01L 24/92; H01L 24/48; H01L 23/49555; H01L 24/32; H01L 21/565; H01L 24/85; H01L 23/49582; H01L 24/83; H01L 2224/2929; H01L 2224/73265
USPC ....................................................... 257/676
See application file for complete search history.

(56) References Cited

U.S. PATENT DOCUMENTS

| | | | | |
|---|---|---|---|---|
| 2002/0168796 | A1* | 11/2002 | Shimanuki | .......... H01L 21/4832 438/106 |
| 2010/0187678 | A1* | 7/2010 | Kajiwara | ................ H01L 21/56 257/692 |

(Continued)

FOREIGN PATENT DOCUMENTS

| JP | 08-46116 A | 2/1996 |
|---|---|---|
| JP | 2014-179541 A | 9/2014 |

*Primary Examiner* — Marcos D. Pizarro
*Assistant Examiner* — Sue Tang
(74) *Attorney, Agent, or Firm* — Mattingly & Malur, PC

(57) ABSTRACT

In order to improve reliability of a semiconductor device, the semiconductor device includes a semiconductor chip, a die pad, a plurality of leads, and a sealing portion. The die pad and the leads are made of a metal material mainly containing copper. A plating layer is formed on a top surface of the die pad. The plating layer is formed by a silver plating layer, a gold plating layer, or a platinum plating layer. The semiconductor chip is mounted on the plating layer on the top surface of the die pad via a bonding material. The plating layer is covered by the bonding material not to be in contact with the sealing portion.

9 Claims, 27 Drawing Sheets

(51) Int. Cl.
*H01L 23/00* (2006.01)
*H01L 23/31* (2006.01)
(52) U.S. Cl.
CPC .............. *H01L 2224/2929* (2013.01); *H01L 2224/29339* (2013.01); *H01L 2224/32245* (2013.01); *H01L 2224/45124* (2013.01); *H01L 2224/45144* (2013.01); *H01L 2224/45147* (2013.01); *H01L 2224/48091* (2013.01); *H01L 2224/48247* (2013.01); *H01L 2224/49171* (2013.01); *H01L 2224/73265* (2013.01); *H01L 2224/83385* (2013.01); *H01L 2224/83855* (2013.01); *H01L 2224/92247* (2013.01); *H01L 2924/181* (2013.01); *H01L 2924/35121* (2013.01)

(56) References Cited

U.S. PATENT DOCUMENTS

2011/0186340 A1* 8/2011 Kuramoto ................ H01B 1/22
174/260
2014/0264383 A1 9/2014 Kajiwara et al.

* cited by examiner

SEMICONDUCTOR DEVICE AND MANUFACTURING METHOD OF THE SAME

CROSS-REFERENCE TO RELATED APPLICATIONS

The disclosure of Japanese Patent Application No. 2016-229032 filed on Nov. 25, 2016 including the specification, drawings and abstract is incorporated herein by reference in its entirety.

BACKGROUND

The present invention relates to a semiconductor device and a manufacturing method thereof and, for example, can be suitably used for a semiconductor device that is packaged to include a semiconductor chip mounted on a chip mounting portion, and a manufacturing method thereof.

A semiconductor device in form of a semiconductor package can be manufactured by mounting a semiconductor chip on a die pad, electrically coupling pad electrodes of the semiconductor chip to leads via wire, and sealing them by resin.

Japanese Unexamined Patent Application Publication No. 2014-179541 describes a technique related to a semiconductor device that includes an SiC chip mounted on a die pad and is packaged. Japanese Unexamined Patent Application Publication No. Hei 8(2011)-46116 describes a technique related to a roughening treatment for a lead frame.

SUMMARY

It is demanded to improve reliability of a semiconductor device that includes a semiconductor chip mounted on a chip mounting portion and is packaged.

Other problems and novel features will be apparent from the description of this specification and the accompanying drawings.

According to an embodiment, a semiconductor device includes a semiconductor chip, a chip mounting portion, a plurality of leads, and a sealing body. The chip mounting portion and the leads are made of a metal material mainly containing copper. A plating layer formed by a silver plating layer, a gold plating layer, or a platinum plating layer is formed on a main surface of the chip mounting portion. The semiconductor chip is mounted on the plating layer on the main surface of the chip mounting portion via a first bonding material. The plating layer is covered by the first bonding material not to be in contact with the sealing body.

According to an embodiment, reliability of a semiconductor device can be improved.

DETAILED DESCRIPTION

Figure 1:
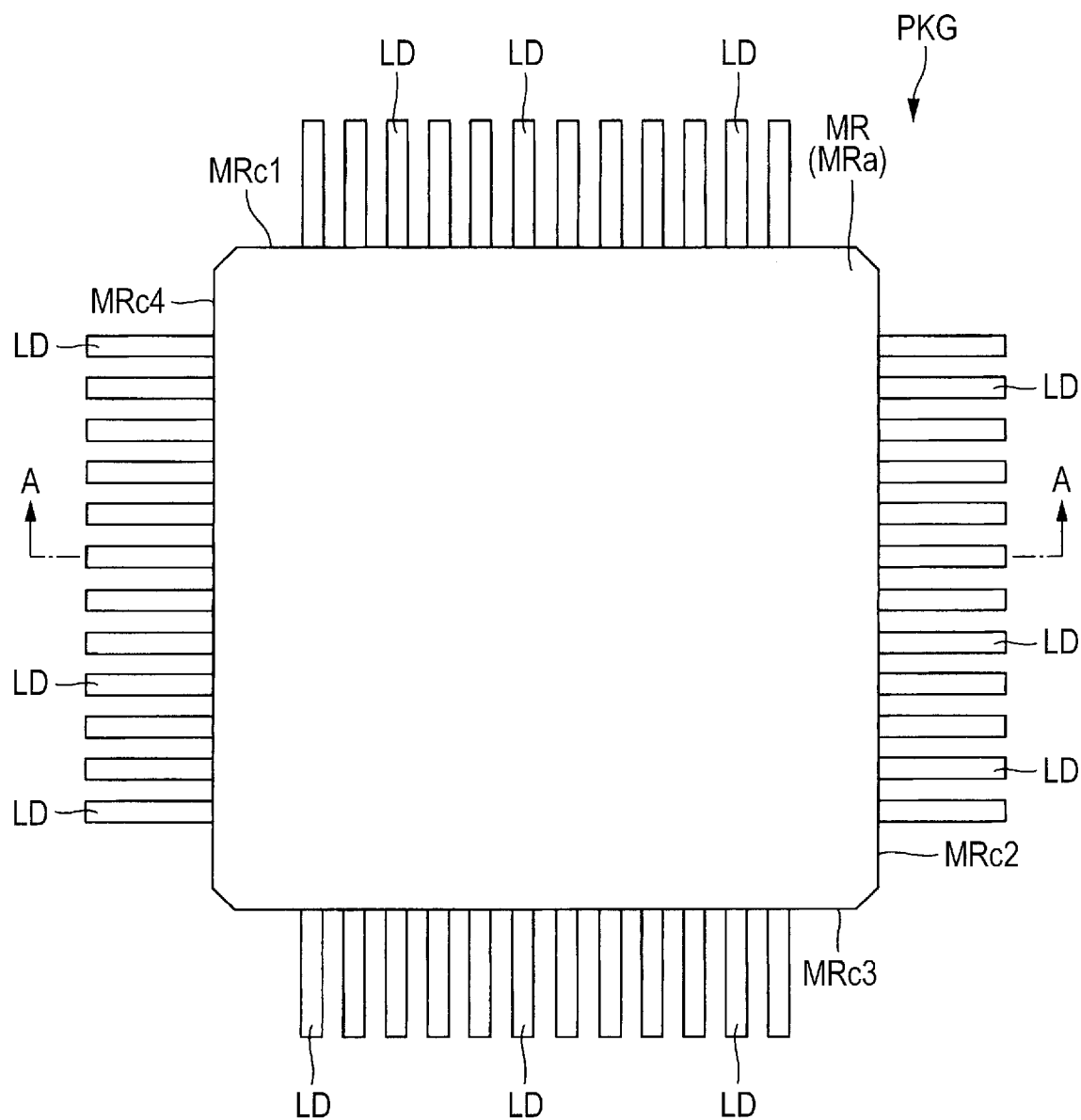
FIG. 1 is a top view of a semiconductor device according to an embodiment.

The following embodiment will be described while being divided into a plurality of sections or embodiments, if necessary for the sake of convenience. However, unless otherwise specified, these are not independent of each other, but are in a relation such that one is a modified example, details, complementary explanation, or the like of a part or the whole of the other. In addition, in the following embodiments, when a reference is made to the number of elements and the like (including number, numerical value, quantity, range, or the like), the number of elements is not limited to the specific number, but may be the specific number or more or the specific number or less, unless otherwise specified, or except the case where the number is apparently limited to the specific number in principle, or except for other cases. Further, in the following embodiments, the constituent elements (including element steps or the like) are not always essential, unless otherwise specified, or except the case where they are apparently considered essential in principle, or except for other cases. Similarly, in the following embodiments, when a reference is made to the shapes, positional relationships, or the like of the constitutional elements or the like, it is understood that they include ones substantially analogous or similar to the shapes or the like, unless otherwise specified, or unless otherwise considered apparently in principle, or except for other cases. This also applies to the foregoing number and range.

An embodiment is described in detail below, with reference to the drawings. Throughout the drawings for explaining the embodiment, members having the same function are labeled with the same reference sign, and the redundant description thereof is omitted. In addition, in the following embodiment, the description of the same or similar portions is not repeated in principle unless it is particularly necessary.

Further, in the drawings used for the embodiment, hatching may be omitted even in a cross-sectional view for the sake of clarity. Furthermore, hatching may be added even in a plan view for the sake of clarity.

Embodiment

A semiconductor device according to an embodiment of the present invention is described with reference to the drawings.

<Structure of Semiconductor Device (Semiconductor Package)>

Figure 2:
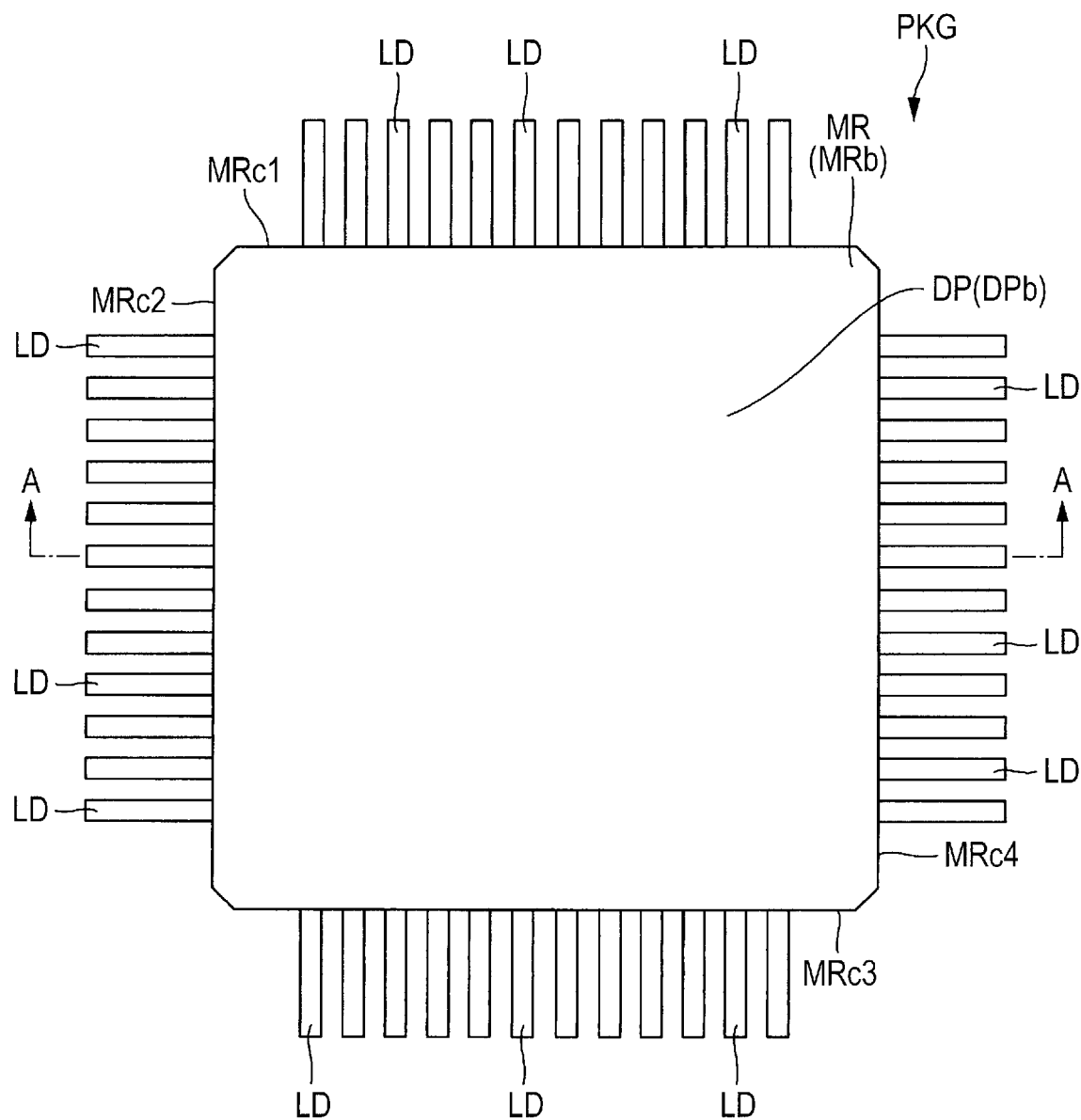
FIG. 2 is a bottom view of the semiconductor device according to the embodiment.
Figure 5:
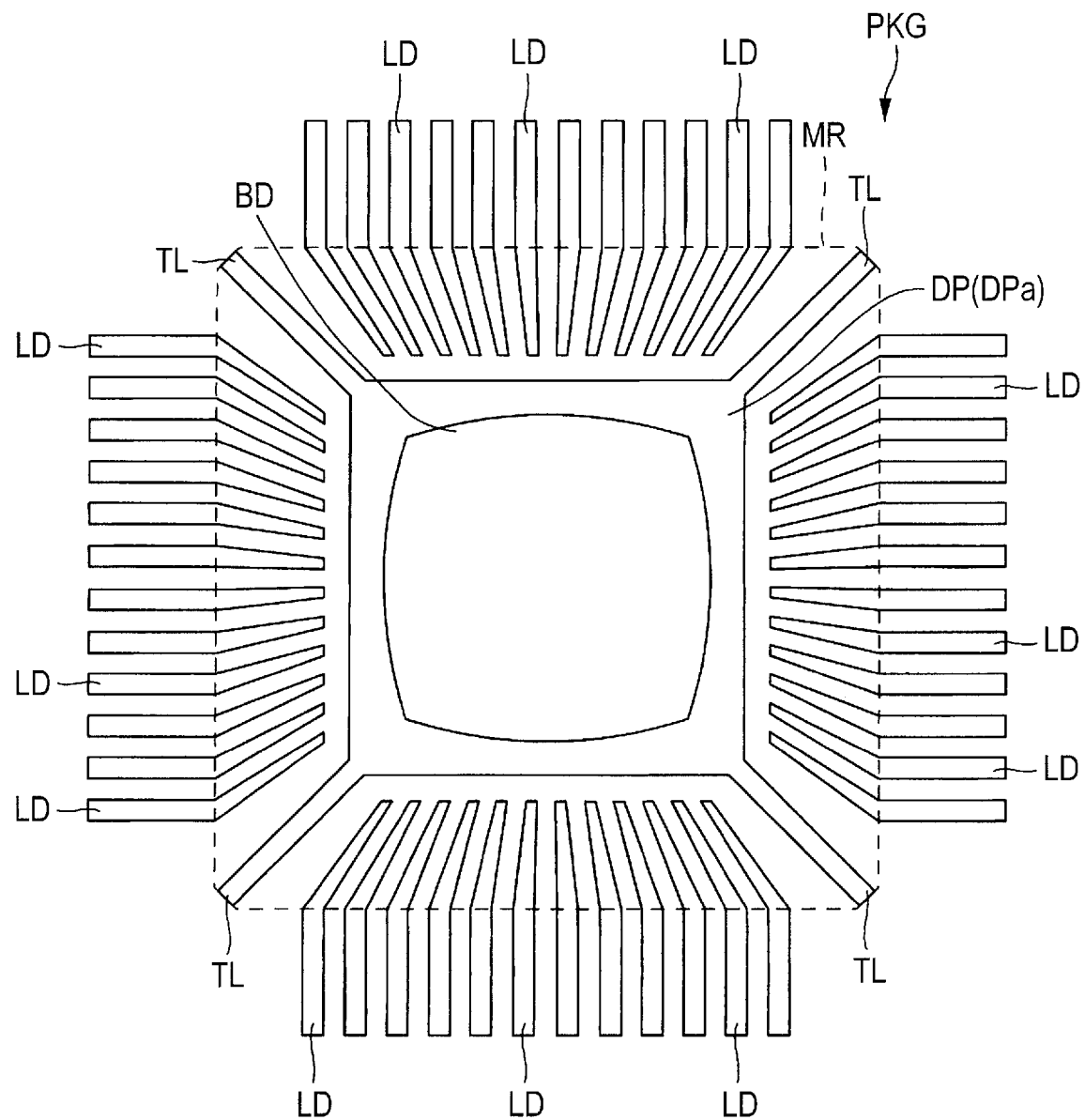
FIG. 5 is a perspective plan view of the semiconductor device according to the embodiment.
Figure 6:
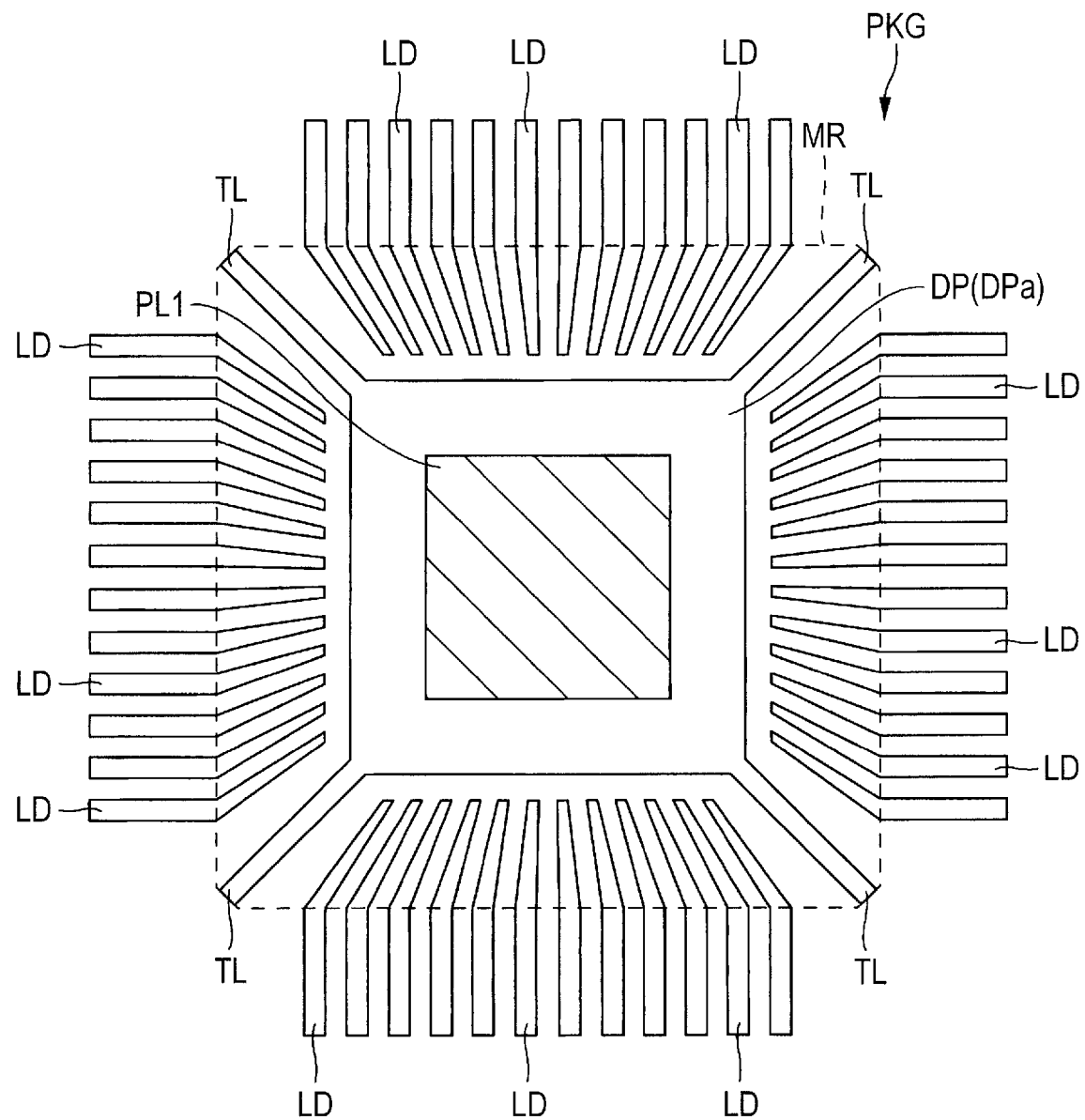
FIG. 6 is a perspective plan view of the semiconductor device according to the embodiment.
Figure 7:
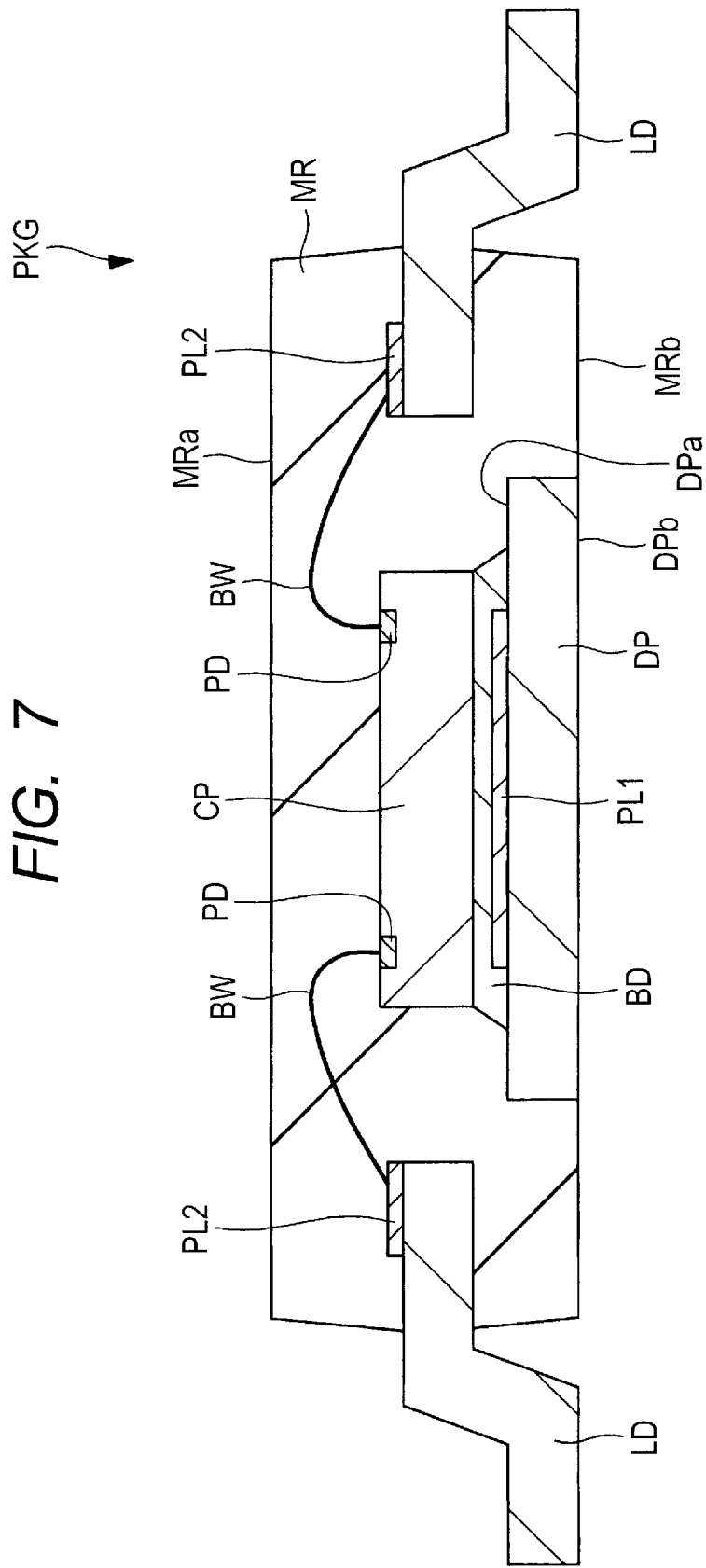
FIG. 7 is a cross-sectional view of the semiconductor device according to the embodiment.
Figure 8:
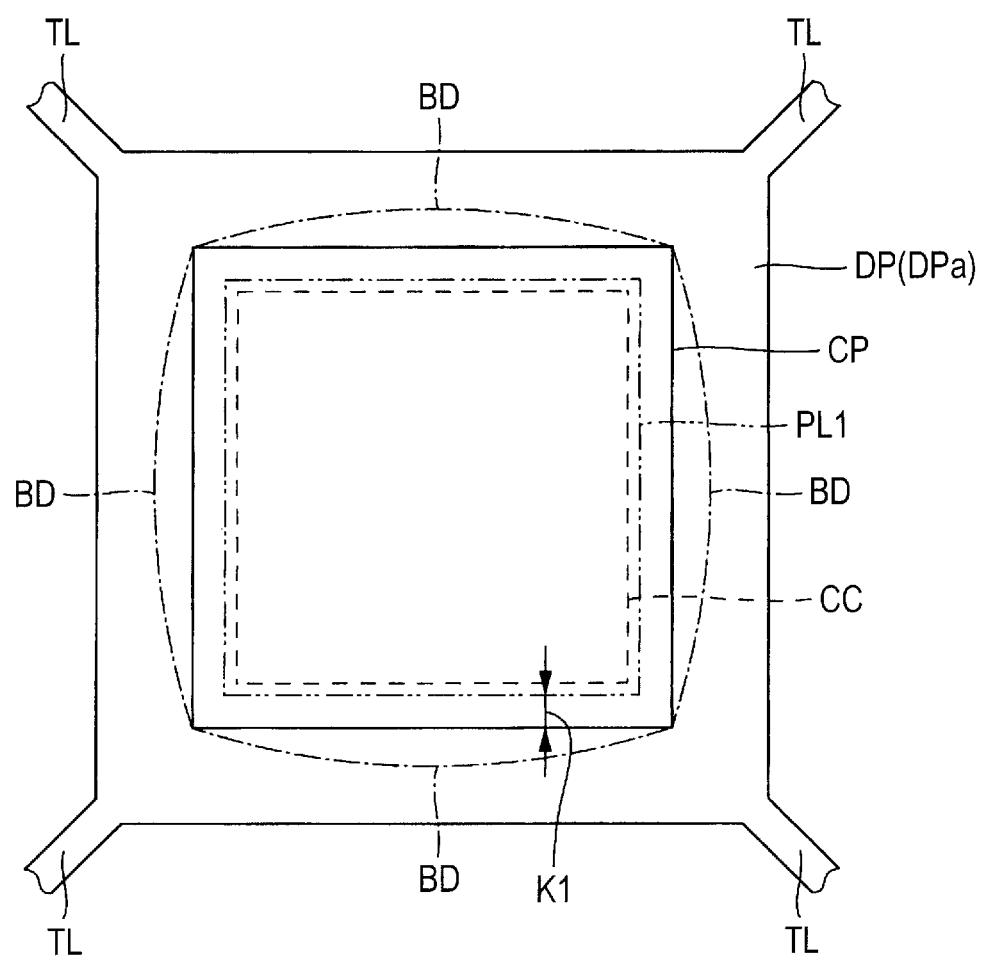
FIG. 8 is a partially enlarged perspective plan view of the semiconductor device according to the embodiment.

FIG. 1 is a top view of a semiconductor device PKG according to an embodiment of the present invention. FIG. 2 is a bottom view (back view) of the semiconductor device PKG. FIGS. 3 to 6 are perspective plan views of the semiconductor device PKG, and FIG. 7 is a cross-sectional view thereof. FIG. 8 is an enlarged perspective plan view (a partially enlarged perspective plan view) of a portion of the semiconductor device PKG.

Figure 3:
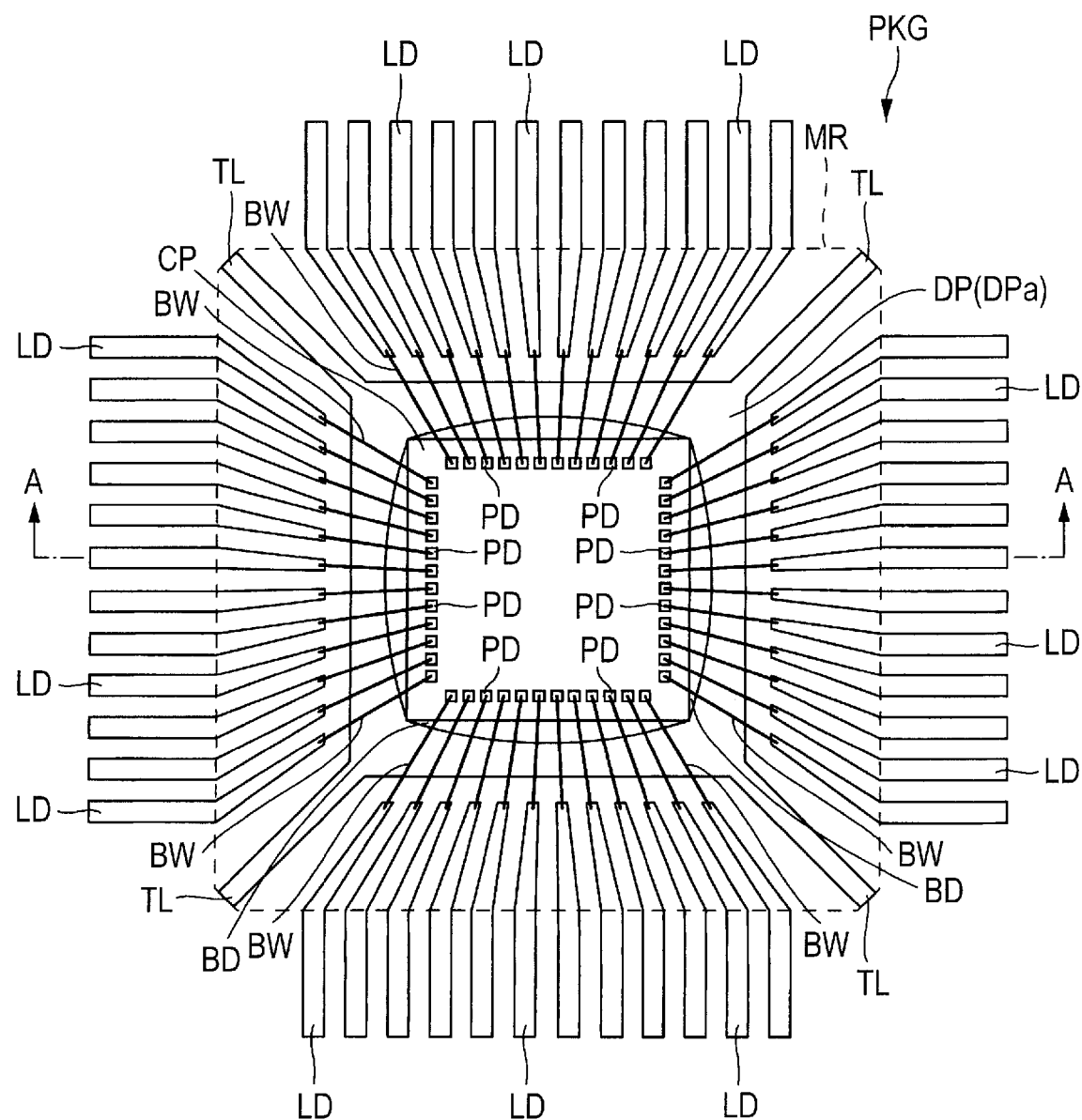
FIG. 3 is a perspective plan view of the semiconductor device according to the embodiment.
Figure 4:
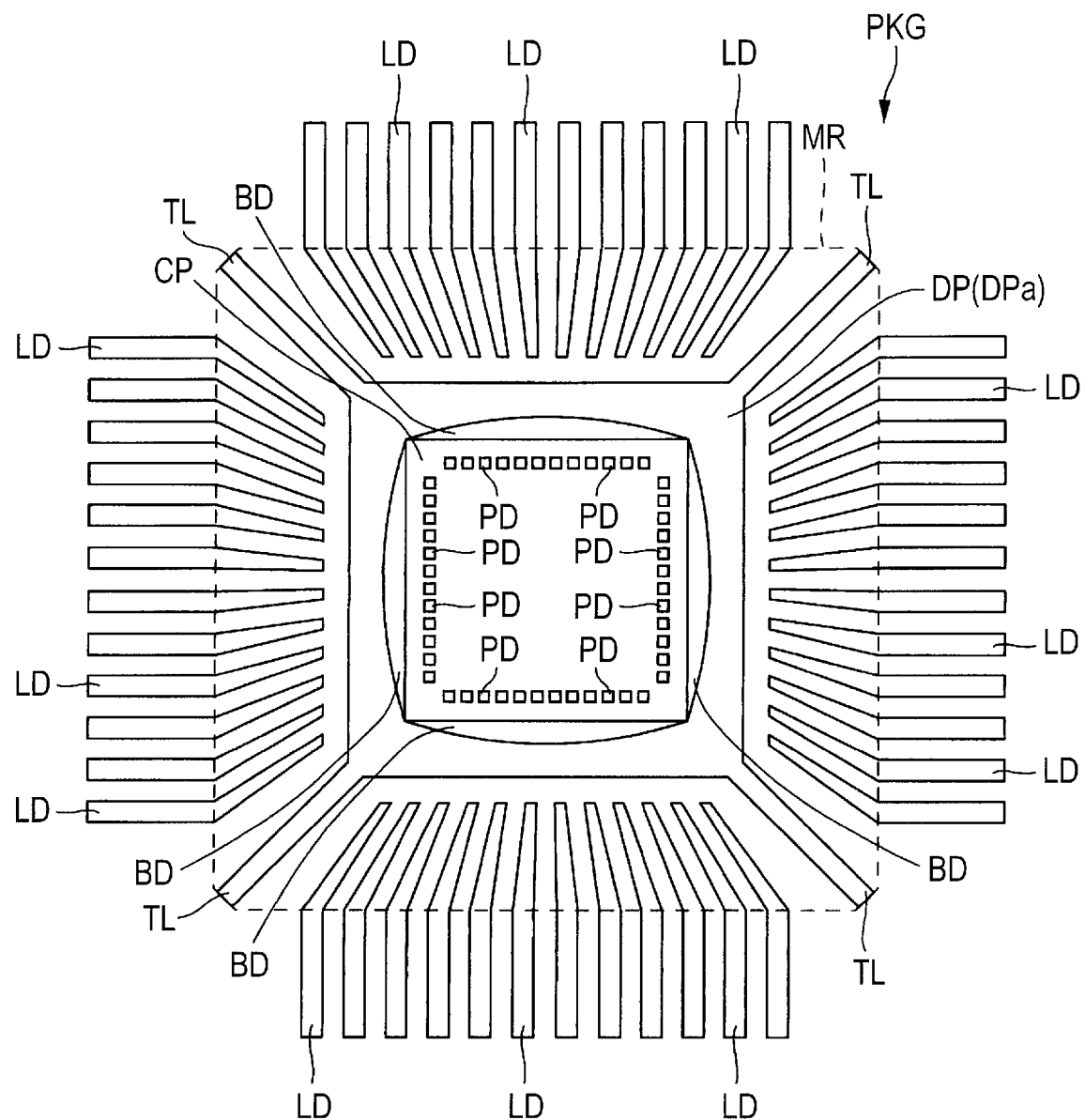
FIG. 4 is a perspective plan view of the semiconductor device according to the embodiment.

FIG. 3 illustrates a perspective plan view of a top surface side of the semiconductor device PKG when a sealing portion MR is seen through. FIG. 4 illustrates a perspective plan view of the top surface side of the semiconductor device PKG, when a wire BW is further seen through (is omitted) in FIG. 3. FIG. 5 illustrates a perspective plan view of the top surface side of the semiconductor device PKG, when a semiconductor chip CP is further seen through (is omitted) in FIG. 4. FIG. 6 illustrates a perspective plan view of the top surface side of the semiconductor device PKG, when a bonding material BD is further seen through (is omitted) in FIG. 4. Although FIG. 6 is a plan view, hatching is added to a plating layer PL1 formed on a top surface DPa of a die pad DP for simplifying the understanding. The orientation of the semiconductor device PKG is the same in FIGS. 1 and 3 to 6. Further, the position of the outer circumference of the sealing portion MR is illustrated with broken line. A cross-section of the semiconductor device PKG along a line A-A in FIGS. 1 to 3 approximately corresponds to FIG. 7. FIG. 8 illustrates the die pad DP and its surrounding portion in the semiconductor device PKG while enlarging them. Further, in FIG. 8, the position (the position of the outer circumference) of the semiconductor chip CP mounted on the top surface DPa of the die pad DP is illustrated with solid line, the position (the position of the outer circumference) of the plating layer PL1 formed on the top surface DPa of the die pad DP is illustrated with long dashed double-short dashed line, the position (the position of the outer circumference) of the bonding material BD is illustrated with long dashed short dashed line, and a circuit forming region CC in the semiconductor chip CP is illustrated with dotted line.

The semiconductor device (semiconductor package) PKG according to the present embodiment illustrated in FIGS. 1 to 8 is a semiconductor device in form of a resin sealed semiconductor package, and is a QFP (Quad Flat Package) semiconductor device here. The configuration of the semiconductor device PKG is described below with reference to FIGS. 1 to 8.

The semiconductor device PKG according to the present embodiment illustrated in FIGS. 1 to 8 includes the semiconductor chip CP, the die pad DP on which the semiconductor chip CP is mounted, a plurality of leads LD each formed by a conductor, a plurality of wires BW electrically coupling a plurality of pad electrodes PD of the semiconductor chip CP and the leads LD, respectively, and the sealing portion (a sealing body) MR that seals those components.

The sealing portion MR, which is a resin sealing portion (a resin sealing body), is formed of a resin material, such as a thermosetting resin material, and can contain fillers or the like. For example, epoxy resin containing fillers can be used for forming the sealing portion MR. Other than the epoxy-based resin, a biphenyl-based thermosetting resin with a phenol-based curing agent, silicone rubber, fillers, and the like added thereto may be used as the material of the sealing portion MR in order to reduce stress, for example.

The sealing portion MR includes a top surface MRa that is one main surface, a bottom surface (a back surface) MRb that is a main surface on the opposite side to the top surface MRa, and side surfaces MRc1, MRc2, MRc3, MRc4 that cross the top surface MRa and the bottom surface MRb. That is, the appearance of the sealing portion MR is in the form of a thin plate surrounded by the top surface MRa, the bottom surface MRb, and the side surfaces MRc1, MRc2, MRc3, and MRc4. Among the side surfaces MRc1, MRc2, MRc3, and MRc4 of the sealing portion MR, the side surfaces MRc1 and MRc3 are located on opposite sides to each other, and the side surfaces MRc2 and MRc4 are located on opposite sides to each other. The side surface MRc1 crosses the side surfaces MRc2 and MRc4, and the side surface MRc3 crosses the side surfaces MRc2 and MRc4.

The planar shape of the sealing portion MR, that is, the planar shape of the top surface MRa and the bottom surface MRb of the sealing portion MR are rectangular, for example. Corners of this rectangle may be rounded, or a given one of the four corners of this rectangle may be rounded off (chamfered).

Each of the leads LD is partly sealed in the sealing portion MR. Another portion of each lead LD projects to the outside of the sealing portion MR from the side surface of the sealing portion MR. In the following description, the portion of the lead LD, located inside the sealing portion MR, is referred to as an inner lead portion, and the portion of the lead LD, located outside the sealing portion MR, is referred to as an outer lead portion.

The semiconductor device PKG of the present embodiment has a structure in which a portion of each lead LD (the outer lead portion) projects from the side surface of the sealing portion MR, and the following description will be made based on this structure. However, the structure of the semiconductor device is not limited thereto. For example, a configuration can be employed, in which the most portion of each lead LD does not project from the side surface of the sealing portion MR and a portion of each lead LD is exposed in the bottom surface MRb of the sealing portion MR (QFN (Quad Flad Non leaded package) configuration), for example.

The die pad DP is a chip mounting portion on which the semiconductor chip CP is mounted. The planar shape of the die pad DP is rectangular, for example. The die pad DP includes atop surface DPa that is one main surface, a bottom surface (a back surface) DPb that is a main surface on the opposite side to the top surface DPa, a side surface along the side surface MRc1 of the sealing portion MR, a side surface along the side surface MRc2 of the sealing portion MR, a side surface along the side surface MRc3 of the sealing portion MR, and a side surface along the side surface MRc4 of the sealing portion MR. Each side surface of the die pad DP crosses the top surface MRa and the bottom surface MRb.

Although the die pad DP is sealed in the sealing portion MR, the bottom surface DPb of the die pad DP is exposed from the bottom surface MRb of the sealing portion MR. The top surface DPa and the side surfaces of the die pad DP are not exposed from the sealing portion MR. FIGS. 2 and 7 illustrate a case where the bottom surface DPb of the die pad DP is exposed from the bottom surface MRb of the sealing portion MR. However, in another embodiment, the die pad DP can be formed not to be exposed from the bottom surface MRb of the sealing portion MR. In that case, the bottom surface DPb of the die pad DP is covered by the sealing portion MR.

Each of the die pad DP and the leads LD is formed by a conductor, is preferably made of a metal material mainly containing copper (Cu), and is specifically made of copper (Cu) or copper alloy. A copper (Cu) content in each of the die pad DP and the leads LD is preferably about 95 atom % or more. Further, it is preferable that the die pad DP and the leads LD are formed of the same material (metal material). In this case, it is possible to easily manufacture a lead frame in which the die pad DP and the leads LD are joined to each other, so that manufacturing of the semiconductor device PKG using the lead frame can be performed easily.

The leads LD included in the semiconductor device PKG are arranged in a surrounding portion of the die pad DP in a plan view. Therefore, the leads LD included in the semiconductor device PKG are formed by a plurality of leads LD arranged on the side surface MRc1 side of the sealing portion MR, a plurality of leads LD arranged on the side surface MRc2 side of the sealing portion MR, a plurality of leads LD arranged on the side surface MRc3 side of the sealing portion MR, and a plurality of leads LD arranged on the side surface MRc4 side of the sealing portion MR.

That is, the inner lead portions of the leads LD are provided (arranged) between the die pad DP and the side surface MRc1 of the sealing portion MR along the side surface MRc1, and the inner lead portions of the leads LD are provided (arranged) between the die pad DP and the side surface MRc2 of the sealing portion MR along the side surface MRc2. Also, inner lead portions of the leads LD are provided (arranged) between the die pad DP and the side surface MRc3 of the sealing portion MR along the side surface MRc3, and the inner lead portions of the leads LD are provided (arranged) between the die pad DP and the side surface MRc4 of the sealing portion MR along the side surface MRc4.

Each of the outer lead portions of the leads LD arranged on the side surface MRc1 side of the sealing portion MR projects to the outside of the sealing portion MR from the side surface MRc1 of the sealing portion MR. Each of the outer lead portions of the leads LD arranged on the side surface MRc2 side of the sealing portion MR projects to the outside of the sealing portion MR from the side surface MRc2 of the sealing portion MR. Each of the outer lead portions of the leads LD arranged on the side surface MRc3 side of the sealing portion MR projects to the outside of the sealing portion MR from the side surface MRc3 of the sealing portion MR. Each of the outer lead portions of the leads LD arranged on the side surface MRc4 side of the sealing portion MR projects to the outside of the sealing portion MR from the side surface MRc4 of the sealing portion MR.

The outer lead portion of each lead LD is bent in such a manner that a bottom surface in the vicinity of an end of the outer lead portion is located on approximately the same plane as the bottom surface MRb of the sealing portion MR. The outer lead portion of the lead LD functions as a terminal portion for external coupling (an external terminal) of the semiconductor device PKG.

A suspension lead TL is integrally formed with the die pad DP at each of four corners of the die pad DP of which the planar shape is rectangular. Each suspension lead TL is formed of the same material as the die pad DP integrally with the die pad DP. The suspension lead TL is integrally formed with each of four corners of the outer edge of the die pad DP, and extends in the sealing portion MR towards a corresponding one of four corners of the sealing portion MR of which the planar shape is rectangular. The suspension lead TL is cut in a portion thereof projecting from the sealing portion MR after the sealing portion MR is formed. A cut surface (an end surface) generated by cutting of the suspension lead TL is exposed in a side surface of each of the four corners of the sealing portion MR.

The semiconductor chip CP is mounted on the top surface DPa of the die pad DP in such a manner that its front surface (a top surface) faces up and its back surface (a bottom surface) faces the die pad DP. The planar dimension (the planar area) of the die pad DP is larger than the planar dimension (the planar area) of the semiconductor chip CP, and the semiconductor chip CP is included in the top surface of the die pad DP in a plan view.

It is assumed that in two main surfaces located on the opposite sides to each other in the semiconductor chip CP, one with a plurality of pad electrodes PD formed thereon is called the front surface of the semiconductor chip CP and the other on the opposite side to the front surface, which faces the die pad DP, is called the back surface of the semiconductor chip CP.

The semiconductor chip CP is manufactured, for example, by forming various types of semiconductor elements or semiconductor integrated circuits on a main surface of a semiconductor substrate (semiconductor wafer) formed of single-crystalline silicon or the like and thereafter separating the semiconductor substrate into semiconductor chips by dicing or the like. The shape of a plane of the semiconductor chip CP, which crosses the thickness thereof, is rectangular. The planar dimensions of the semiconductor chip CP are about 2 mm by 2 mm, for example, but are not limited thereto.

The plating layer (a plating film) PL1 is formed on the top surface DPa of the die pad DP. The plating layer PL1 is preferably a silver (Ag) plating layer, a gold (Au) plating layer, or a platinum (Pt) plating layer. Therefore, the plating layer PL1 is preferably a silver layer (Ag layer), a gold layer (Au layer), or a platinum layer (Pt layer), which is formed by plating. The plating layer PL1 is not formed on the entire top surface DPa of the die pad DP, but is formed on a portion (around a center portion) of the top surface DPa of the die pad DP.

The semiconductor chip CP is mounted on the plating layer PL1 on the top surface DPa of the die pad DP via a bonding material (a bonding material layer, an adhesive layer) BD. That is, the back surface of the semiconductor chip CP is bonded (adhered) to be fixed to the plating layer PL1 on the top surface DPa of the die pad DP via the bonding material BD. The semiconductor chip CP is sealed in the sealing portion MR, and is not exposed from the sealing portion MR.

The bonding material BD is made of a conductive bonding material containing a conductive material and a resin material. A conductive paste type bonding material (adhesive material), such as silver (Ag) paste, can be suitably used as the bonding material BD. In the manufactured semiconductor device PKG, the bonding material BD has been already cured.

The die pad DP can also have a function of a heat sink for dissipating heat generated in the semiconductor chip CP. The heat generated in the semiconductor chip CP is conducted to the die pad DP through the bonding material BD and the plating layer PL1. In a case where the bottom surface DPb of the die pad DP is exposed from the bottom surface MRb of the sealing portion MR, the heat conducted from the semiconductor chip CP to the die pad DP can be dissipated to the outside of the semiconductor device PKG from the bottom surface DPb of the die pad DP exposed from the sealing portion MR. Because the bonding material BD interposed between the semiconductor chip CP and the die pad PD is conductive, the thermal conductivity is high. The high thermal conductivity of the bonding material BD is advantageous in efficiently conducting the heat generated in the semiconductor chip CP to the die pad DP through the bonding material BD. Further, in a case where a back electrode is formed on the back surface of the semiconductor chip CP, that back electrode can be electrically coupled to the die pad DP via the bonding material BD that is electrically conducting and the plating layer PL1, because the bonding material BD is electrically conductive.

In the semiconductor device PKG of the present embodiment, the plating layer PL1 formed on the top surface DPa of the die pad DP is covered by the bonding material BD, but is not in contact with the sealing portion MR. That is, as is apparent from FIGS. 5 to 8, a region of the top surface DPa of the die pad DP, on which the plating layer PL1 is formed, is included in a region where the bonding material BD is arranged in a plan view, and the plating layer PL1 is entirely covered by the bonding material BD. Therefore, the plating layer PL1 and the sealing portion MR are not in contact with each other. In other words, the bottom surface of the plating layer PL1 is entirely in contact with the top surface DPa of the die pad DP and the entire top surface and the entire side surfaces of the plating layer PL1 are in contact with the bonding material BD. Therefore, the plating layer PL1 is not in contact with the sealing portion MR.

Further, as is also apparent from FIGS. 7 and 8 and the like, the planar dimensions (the planar area) of the plating layer PL1 are smaller than the planar dimensions (the planar area) of the semiconductor chip CP, and the plating layer PL1 is included in the semiconductor chip CP in a plan view. Because the plating layer PL1 is included in the semiconductor chip CP in a plan view, an outer circumferential region in the semiconductor chip CP does not overlap the plating layer PL1 in a plan view. Instead, a region of the semiconductor chip CP, inside the outer circumferential region, overlaps the plating layer PL1 in a plan view. Therefore, the bonding material BD is present on the entire plating layer PL, the semiconductor chip CP is present on the bonding material BD, and the bonding material BD and the plating layer PL1 are present below the region of the semiconductor chip CP inside the outer circumferential region. However, directly below the outer circumferential region in the semiconductor chip CP, the plating layer PL1 is not present although the bonding material BD is present. Below the bonding material BD directly below the outer circumferential region of the semiconductor chip CP, the top surface of the die pad DP in a region where the plating layer PL1 is not formed is present.

The bonding material BD is present below the entire back surface of the semiconductor chip CP. Therefore, if the plating layer PL1 is included in the semiconductor chip CP in a plan view, the entire plating layer PL1 is inevitably covered by the bonding material BD, so that it is possible to prevent the plating layer PL1 from being in contact with the sealing portion MR accurately. Although the details will be described later, because the plating layer PL1 is arranged not to be in contact with the sealing portion MR in the present embodiment, it is possible to suppress or prevent of peeling of the sealing portion MR, thereby improving reliability of a semiconductor device.

A plurality of pad electrodes (pads, bonding pads) PD are formed on the front surface of the semiconductor chip CP. The pad electrodes PD of the semiconductor chip CP and the leads LD are electrically coupled to each other via a plurality of wires (bonding wires) BS, respectively. That is, an end of each wire BW is coupled to the pad electrode PD of the semiconductor chip CP, and the other end of the wire BW is coupled to a corresponding lead LD. In this manner, the pad electrode PD of the semiconductor chip CP and the corresponding lead LD are electrically coupled to each other via the wire BW.

The front surface of the semiconductor chip CP is rectangular in a planar shape, and has a side along the side surface MRc1 of the sealing portion MR (a side on the side surface MRc1 side), a side along the side surface MRc2 of the sealing portion MR (a side on the side surface MRc2 side), a side along the side surface MRc3 of the sealing portion MR (a side on the side surface MRc3 side), and a side along the side surface MRc4 of the sealing portion MR (a side on the side surface MRc4 side). The pad electrodes PD arranged along the side on the side surface MRc1 side on the front surface of the semiconductor chip CP are electrically coupled to the leads LD arranged on the side surface MRc1 side of the sealing portion MR via the wires BW, respectively. The pad electrodes PD arranged along the side on the side surface MRc2 side on the front surface of the semiconductor chip CP are electrically coupled to the leads LD arranged on the side surface MRc2 side of the sealing portion MR via the wires BW, respectively. The pad electrodes PD arranged along the side on the side surface MRc3 side on the front surface of the semiconductor chip CP are electrically coupled to the leads LD arranged on the side surface MRc3 side of the sealing portion MR via the wires BW, respectively. The pad electrodes PD arranged along the side on the side surface MRc4 side on the front surface of the semiconductor chip CP are electrically coupled to the leads LD arranged on the side surface MRc4 side of the sealing portion MR via the wires BW, respectively.

The wires (bonding wires) BW are conductive members, and are more particularly conductive wires. The wires BW are made of metal, and therefore can be regarded as metal lines (metal fine lines). As the wires BW, gold (Au) wires, copper (Cu) wires, or aluminum (Al) wires can be suitably used. The wires BW are sealed in the sealing portion MR, and are not exposed from the sealing portion MR. In each lead LD, a portion to which a corresponding wire BW is coupled is the inner lead portion located in the sealing portion MR (more particularly, the top surface of the inner lead portion).

Also, a plating layer PL2 may be provided on the top surface of the inner lead portion of each lead LD. In a case where the plating layer PL2 is provided, one end of each wire BW (that is the opposite end to the end coupled to the pad electrode PD) is coupled to the plating layer PL2 on the top surface of the inner lead portion of the lead LD. By coupling the wire BW to the plating layer PL2 on the top surface of the inner lead portion of the lead LD, it is possible to increase the coupling strength of the wire BW. The plating layer PL2 can be formed of the same material as the above plating layer PL1. That is, it is preferable that in a case where the plating layer PL1 is a silver (Ag) plating layer, the plating layer PL2 is also formed by a silver (Ag) plating layer, in a case where the plating layer PL1 is a gold (Au) plating layer, the plating layer PL2 is also formed by a gold (Au) plating layer, and in a case where the plating layer PL1 is a platinum (Pt) plating layer, the plating layer PL2 is also formed by a platinum (Pt) plating layer. If the plating layer PL2 and the above plating layer PL1 are formed of the same material as each other, the plating layer PL2 and the plating layer PL1 can be formed by the same (common) plating process. Therefore, it is possible to easily manufacture a lead frame, so that manufacturing of the semiconductor device PKG using the lead frame can be easier.

<Manufacturing Process of Semiconductor Device>

Figure 9:
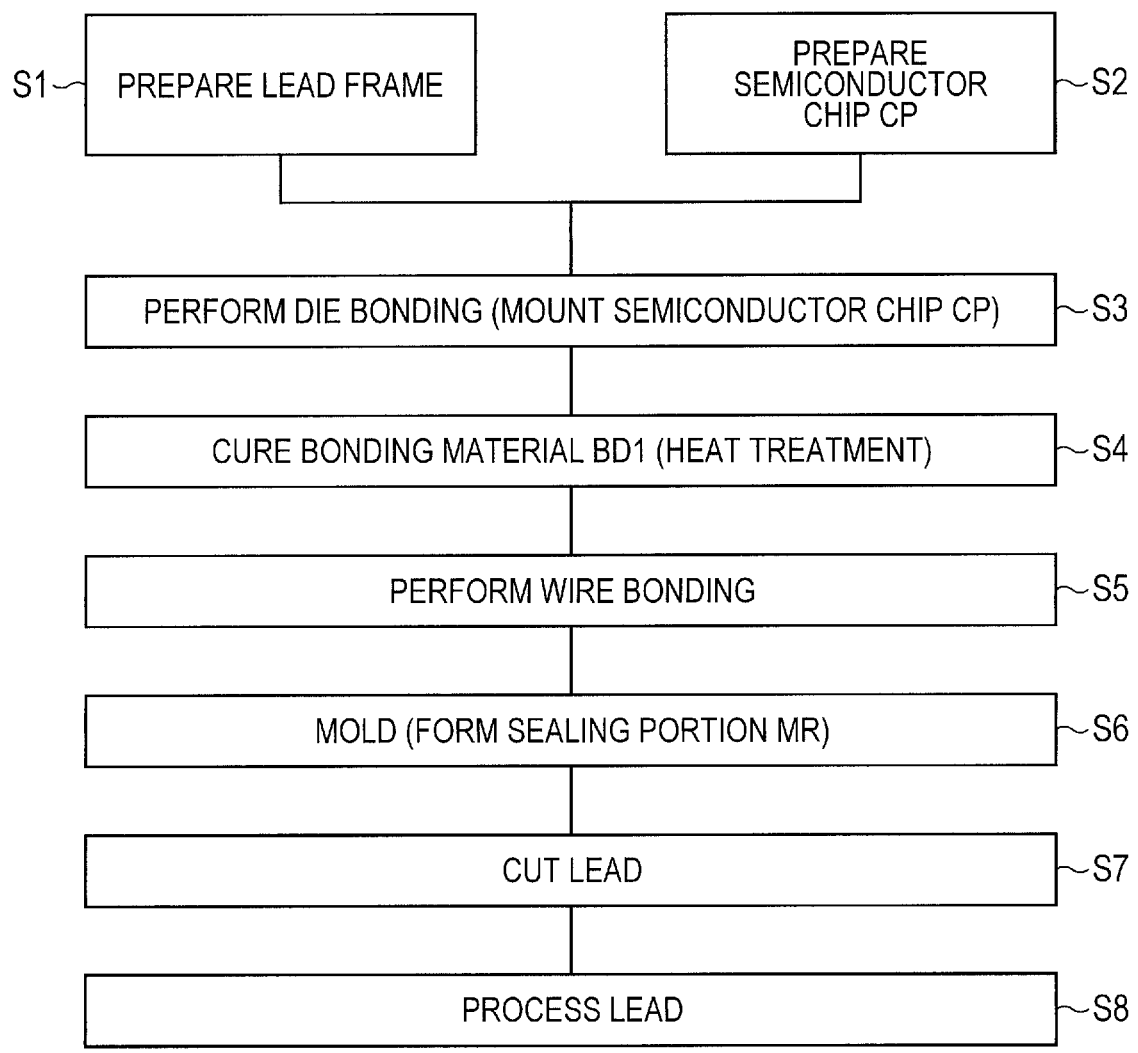
FIG. 9 is a process flowchart illustrating a manufacturing process of the semiconductor device according to the embodiment.

Next, a manufacturing process (an assembling process) of the semiconductor device PKG illustrated in FIGS. 1 to 8 are described. FIG. 9 is a process flowchart illustrating the manufacturing process of the semiconductor device PKG illustrated in FIGS. 1 to 8. FIGS. 10 to 18 are plan views or cross-sectional views during the manufacturing process of the semiconductor device PKG. In FIGS. 10 to 18, FIGS. 10, 12, 14, and 16 are plan views, and FIGS. 11, 13, 15, 17, and 18 are cross-sectional views and illustrate a cross-section corresponding to FIG. 7.

When the semiconductor device PKG is manufactured, first a lead frame LF is prepared (Step S1 in FIG. 9), and the semiconductor chip CP is prepared (Step S2 in FIG. 9). Either of the lead frame LF and the semiconductor chip CP may be prepared before the other, and they may be prepared simultaneously.

Figure 10:
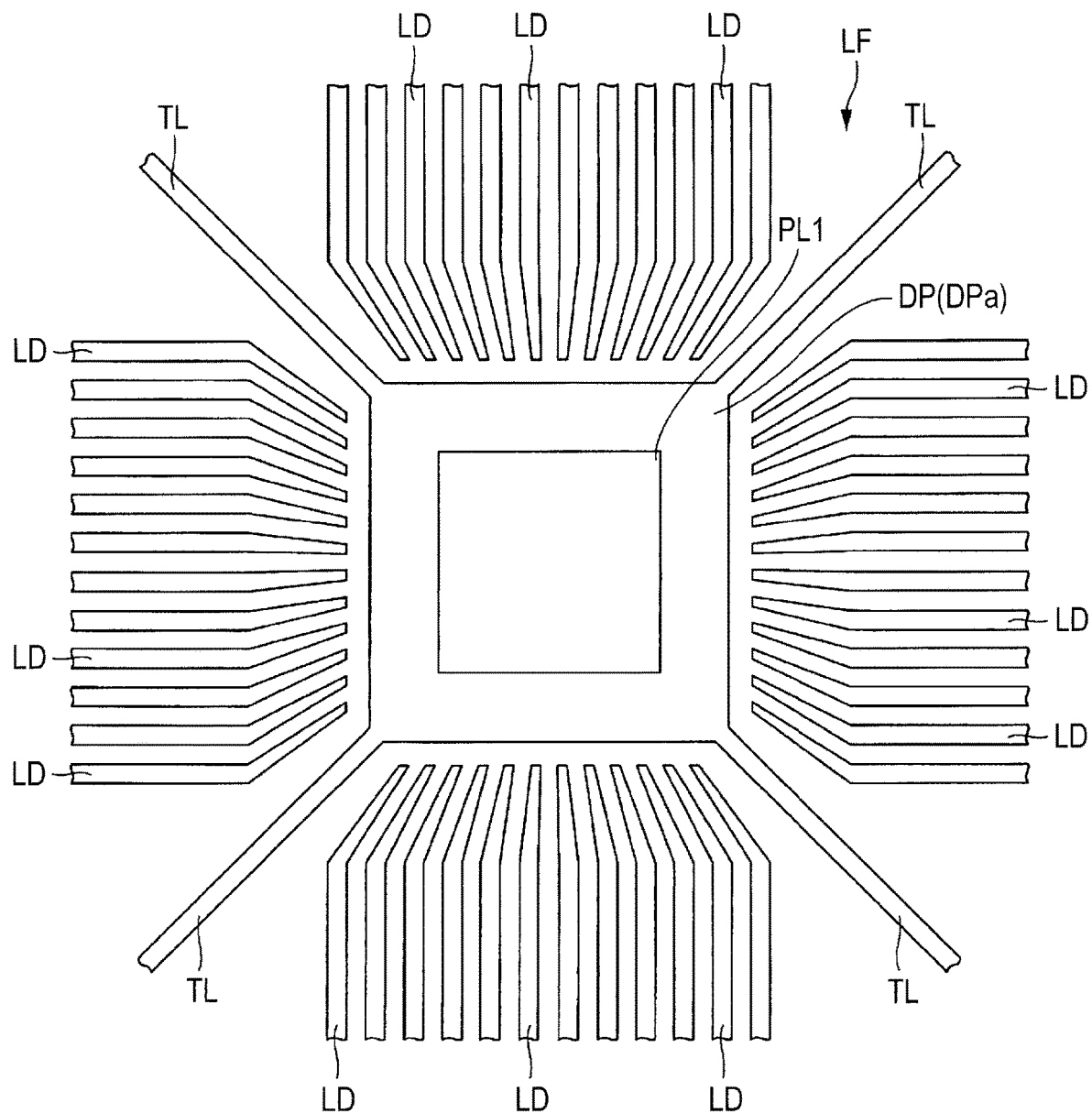
FIG. 10 is a plan view of a lead frame for manufacturing the semiconductor device according to the embodiment.
Figure 11:
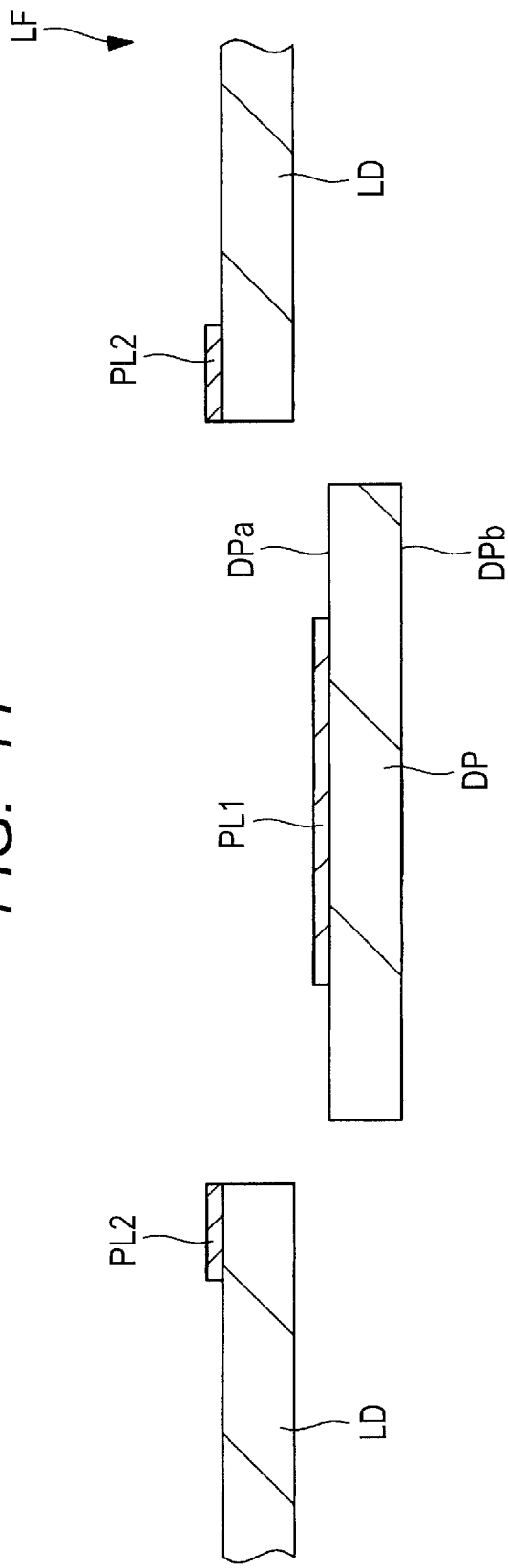
FIG. 11 is a cross-sectional view of the lead frame of FIG. 10.

As illustrated in FIGS. 10 and 11, the lead frame LF integrally includes a framework (not illustrated), a plurality of leads LD joined to the framework, a die pad DP joined to the framework via a plurality of suspension leads TL. The lead frame LF is made of a metal material mainly containing of copper (Cu) and is, more specifically, made of copper (Cu) or copper (Cu) alloy. The plating layer PL1 is formed on the top surface DPa of the die pad DP of the lead frame LF. Further, the plating layer PL2 is formed on a top surface of a tip (a tip of the inner lead portion) of each lead LD of the lead frame LF. Each of the plating layers PL1 and PL2 can be formed by plating (preferably, electrolytic plating). The planar dimensions (the planar area) of the plating layer PL1 formed on the top surface DPa of the die pad DP of the lead frame are smaller than the planar dimensions (the planar area) of the semiconductor chip CP that will be mounted later.

The lead frame LF can be manufactured by processing a metal plate (a copper plate or a copper alloy plate). After the lead frame LF is manufactured by processing the metal plate, the plating layer PL1 on the top surface of the die pad DP of the lead frame LF and the plating layer PL2 on the top surface of the inner lead portion of the lead LD of the lead frame LF are formed by plating (preferably electrolytic plating). The plating layer PL1 and the plating layer PL2 can be formed in the same plating process. In this manner, the lead frame LF that includes the die pad DP with the plating layer PL1 formed thereon and the leads LD with the plating layer PL2 formed thereon, integrally with each other, can be prepared.

Figure 12:
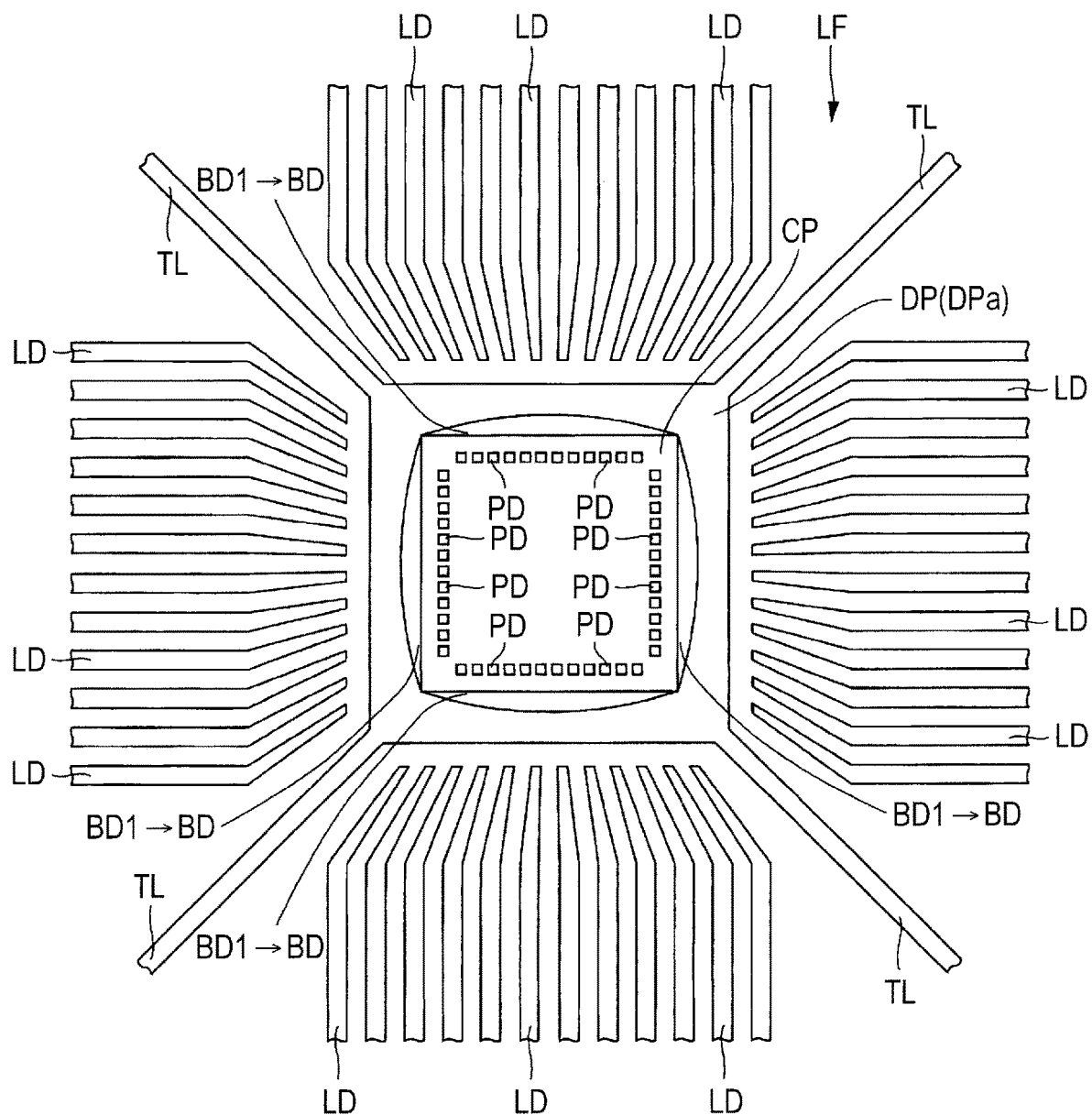
FIG. 12 is a plan view illustrating a die bonding process.
Figure 13:
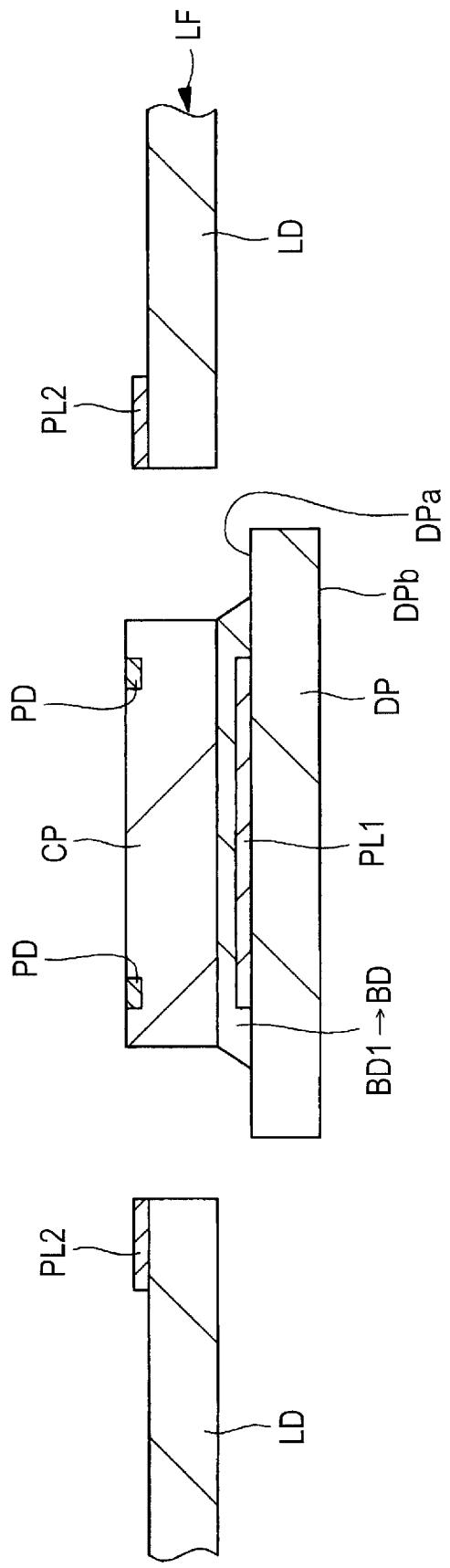
FIG. 13 is a cross-sectional view illustrating the die bonding process.

Subsequently, a die bonding process of the semiconductor chip CP is performed, so that the semiconductor chip CP is mounted on the die pad DP (on the plating layer PL1) of the lead frame LF via a conductive bonding material BD1, as illustrated in FIGS. 12 and 13 (Step S3 in FIG. 9). Specifically, the die bonding process in Step S3 can be performed in the following manner.

First, the bonding material BD1 is supplied (applied) onto the top surface DPa of the die pad DP of the lead frame LF. The bonding material BD1 is formed of a conductive bonding material containing a conductive material and a resin material. A conductive paste type bonding material (adhesive), such as silver (Ag) paste, can be suitably used as the bonding material BD1. As the conductive material contained in the bonding material BD1, metal particles, such as silver (Ag) particles, can be suitably used.

The bonding material BD1 will become the above bonding material BD later, but has not been cured in this step and has viscosity. That is, the bonding material BD1 in this step is a paste-like (flowable) bonding material. The bonding material BD1 is supplied (applied) to a chip mounting region (a region where the semiconductor chip CP is to be mounted) of the top surface DPa of the die pad DP of the lead frame. Because on the top surface DPa of the die pad DP of the lead frame, the plating layer PL1 is formed in the region where the semiconductor chip CP is to be mounted, the bonding material BD1 is supplied (applied) onto the plating layer PL1 on the top surface DPa of the die pad DP.

At this time (a time after the bonding material BD1 is supplied and before the semiconductor chip CP is mounted), the plating layer PL1 is not completely covered by the bonding material BD1, and is not included in the bonding material BD1 in a plan view. At this time, a portion of the plating layer PL1 is exposed without being covered by the bonding material BD.

Thereafter, the semiconductor chip CP is arranged (mounted) on the chip mounting area of the top surface DPa of the die pad DP of the lead frame. In this step, the semiconductor chip CP is arranged on the top surface DPa of the die pad DP in such a manner that the front surface side of the semiconductor chip CP faces up and the back surface side faces down (that is, towards the top surface DPa of the die pad DP), i.e., a face-up manner. That is, the semiconductor chip CP is arranged on the top surface DPa of the die pad DP with the back surface thereof opposed to the top surface of the die pad DP. Because on the top surface DPa of the die pad DP of the lead frame, the plating layer PL1 is formed in the region where the semiconductor chip CP is to be mounted, the semiconductor chip CP is arranged (mounted) on the plating layer PL1 on the top surface DPa of the die pad DP via the bonding material BD1.

While the paste-like (that is, flowable) bonding material BD1 is arranged on the chip mounting region of the top surface DPa of the die pad DP (that is, the bonding material BD1 has not been cured), the semiconductor chip CP is arranged on the chip mounting region of the top surface DPa of the die pad DP. In this step, a load (a force) in an approximately perpendicular direction to the front surface of the semiconductor chip CP (the main surface on the side on which the pad electrode PD is formed) is applied to the front surface of the semiconductor chip CP. Therefore, the bonding material BD1 is pressed by the back surface of the semiconductor chip CP to spread, so that the bonding material BD1 spreads throughout a region between the back surface of the semiconductor chip CP and the top surface DPa of the die pad DP. In this manner, a space between the back surface of the semiconductor chip CP and the top surface DPa of the die pad DP is filled with the bonding material BD1. Because the plating layer PL is formed on the top surface DPa of the die pad DP, a space between the back surface of the semiconductor chip CP and the plating layer PL1 is filled with the bonding material BD1. In addition, the bonding material BD1 pressed by the back surface of the semiconductor chip CP to spread may slightly protrude from the semiconductor chip CP in a plan view.

The semiconductor chip CP is arranged in such a manner that the planar dimensions (the planar area) of the plating layer PL1 formed on the top surface DPa of the die pad DP are smaller than the planar dimensions (the planar area) of the semiconductor chip CP and the plating layer PL1 is included in the semiconductor chip CP in a plan view. That is, the mounted semiconductor chip CP includes the plating layer in a plan view. Therefore, when the semiconductor chip CP is arranged on the die pad DP, the plating layer PL1 is entirely covered by the bonding material BD1, so that the plating layer PL1 is no longer exposed. That is, when the semiconductor chip CP is arranged on the die pad DP, the plating layer PL1 is entirely covered by the bonding material BD not to be exposed.

Because the load in the approximately perpendicular direction to the front surface (the main surface on which the pad electrode PD is formed) of the semiconductor chip CP is applied to the semiconductor chip CP when the semiconductor chip CP is mounted, the bonding material BD1 is pressed by the back surface of the semiconductor chip CP to spread. Thus, the plating layer PL1 is entirely covered by the bonding material BD1, so that the plating layer PL1 is included in the bonding material BD1 in a plan view.

Subsequently, a heat treatment (baking) is performed to cure the bonding material BD1 (Step S4 in FIG. 9). Thus, the bonding material BD1 is cured to be the bonding material BD. The bonding material BD is the cured bonding material BD1. When a thermosetting resin material is used as the resin material contained in the bonding material BD1, the thermosetting resin material contained in the bonding material can be cured by the heat treatment, thereby curing the bonding material BD1. The semiconductor chip CP is bonded to be fixed to the die pad DP (the plating layer PL1) by the cured bonding material BD1 (that is, the bonding material BD). The plating layer PL1 formed on the top surface DPa of the die pad DP is entirely covered by the bonding material BD, and is therefore not exposed. That is, the plating layer PL1 formed on the top surface DPa of the die pad DP is completely covered by the cured bonding material BD, and therefore does not include an exposed portion. For this reason, it is possible to prevent the plating layer PL1 from being into contact with the sealing portion MR when the sealing portion MR is formed later.

Further, the bonding material BD1 is pressed by the back surface of the semiconductor chip CP to spread in die bonding. Thus, the semiconductor chip CP is included in the bonding material BD1 in a plan view and is therefore included in the bonding material BD in a plan view after the bonding material BD1 is cured.

Figure 14:
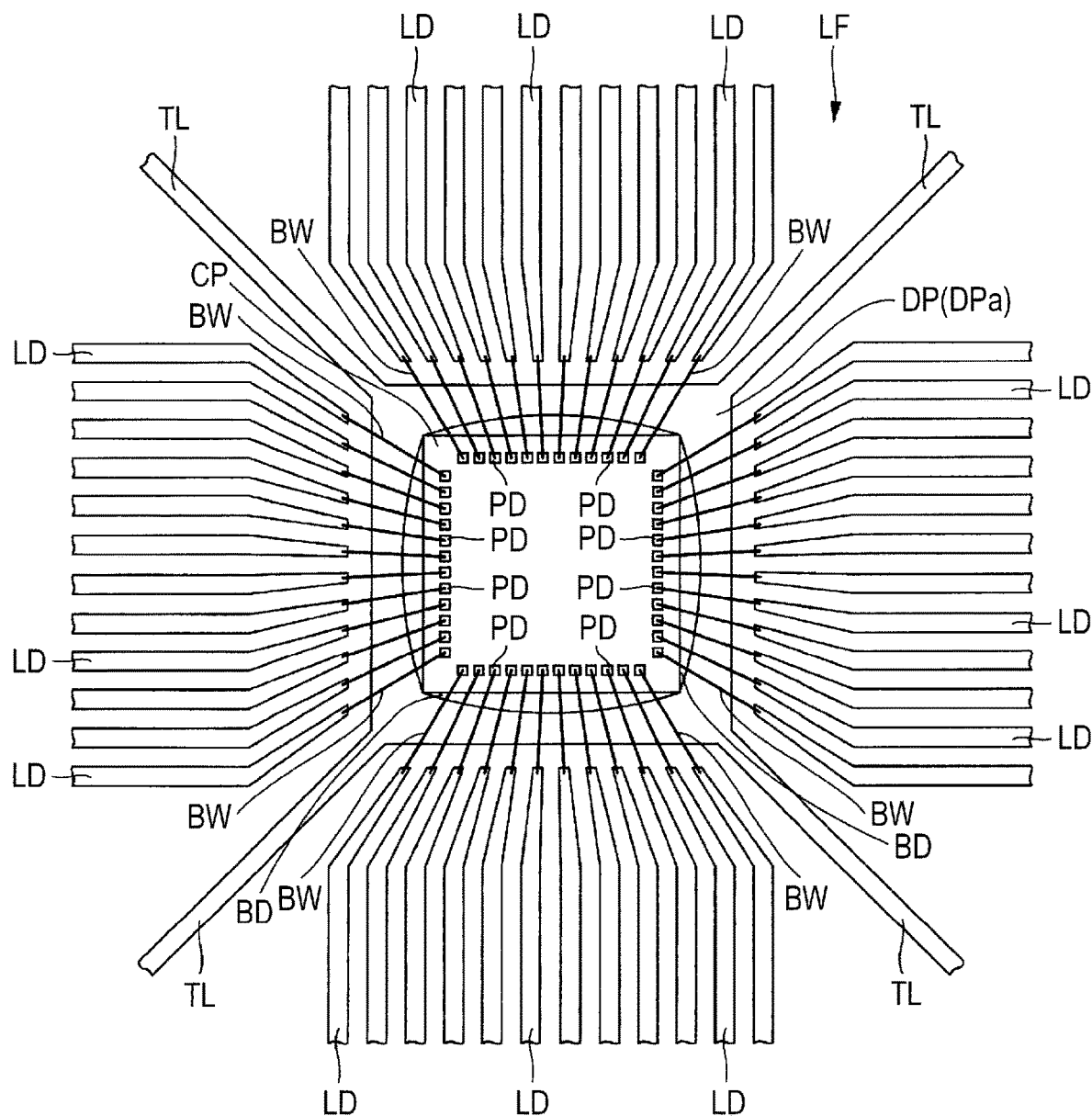
FIG. 14 is a plan view illustrating a wire bonding process.
Figure 15:
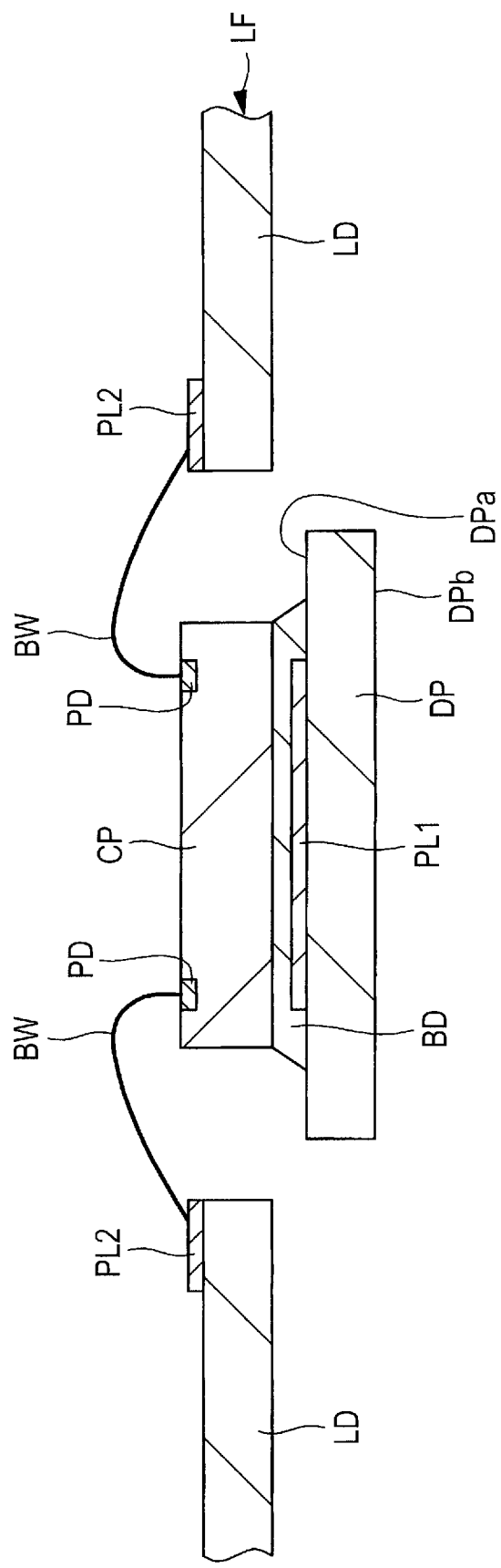
FIG. 15 is a cross-sectional view illustrating the wire bonding process.

Subsequently, a wire bonding process is performed, as illustrated in FIGS. 14 and 15 (Step S5 in FIG. 9).

In the wire bonding process in Step S5, the pad electrodes PD of the semiconductor chip CP and the leads LD of the lead frame LF are electrically coupled to each other via the wires BW, respectively.

Figure 16:
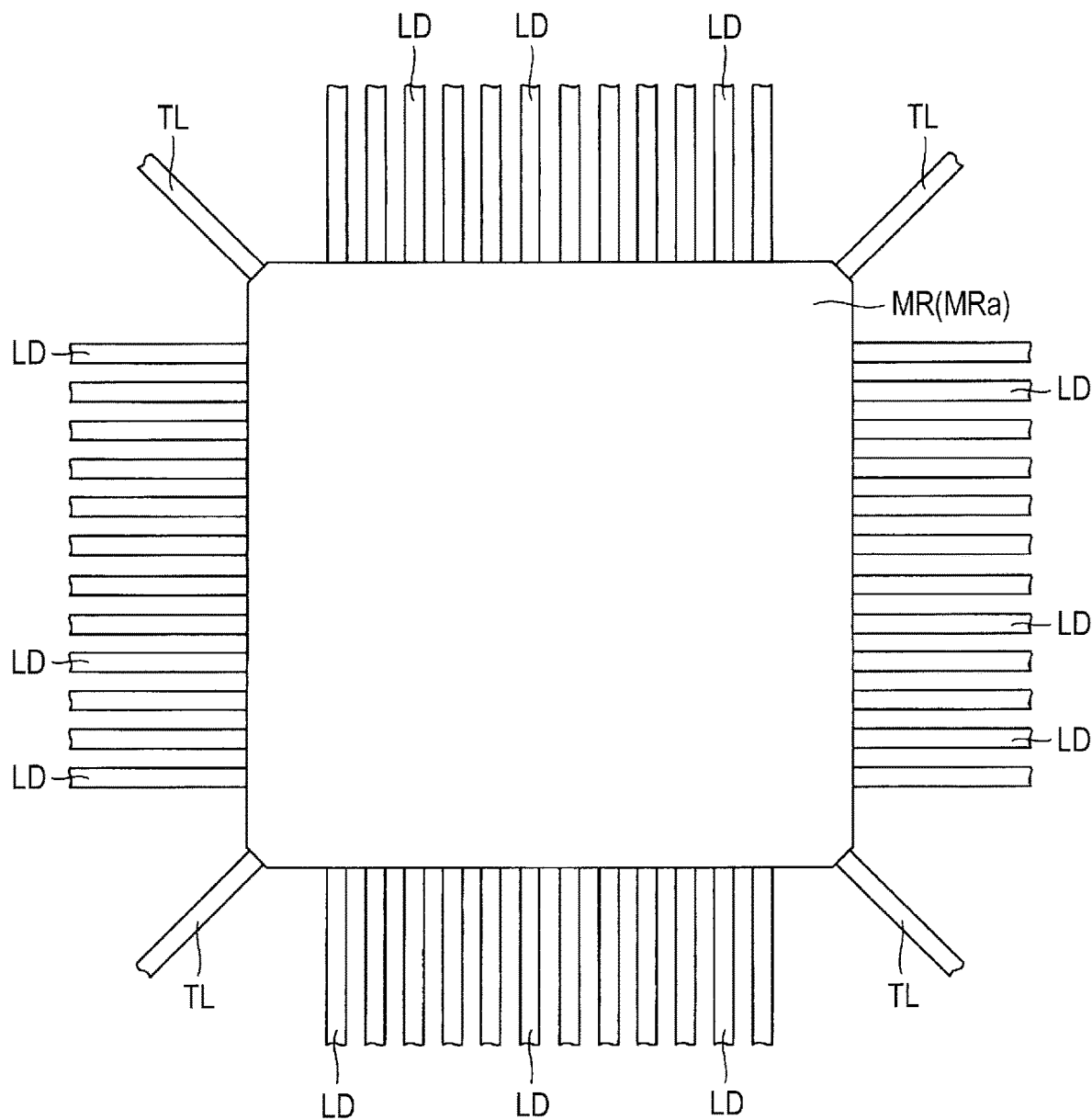
FIG. 16 is a plan view illustrating a molding process.
Figure 17:
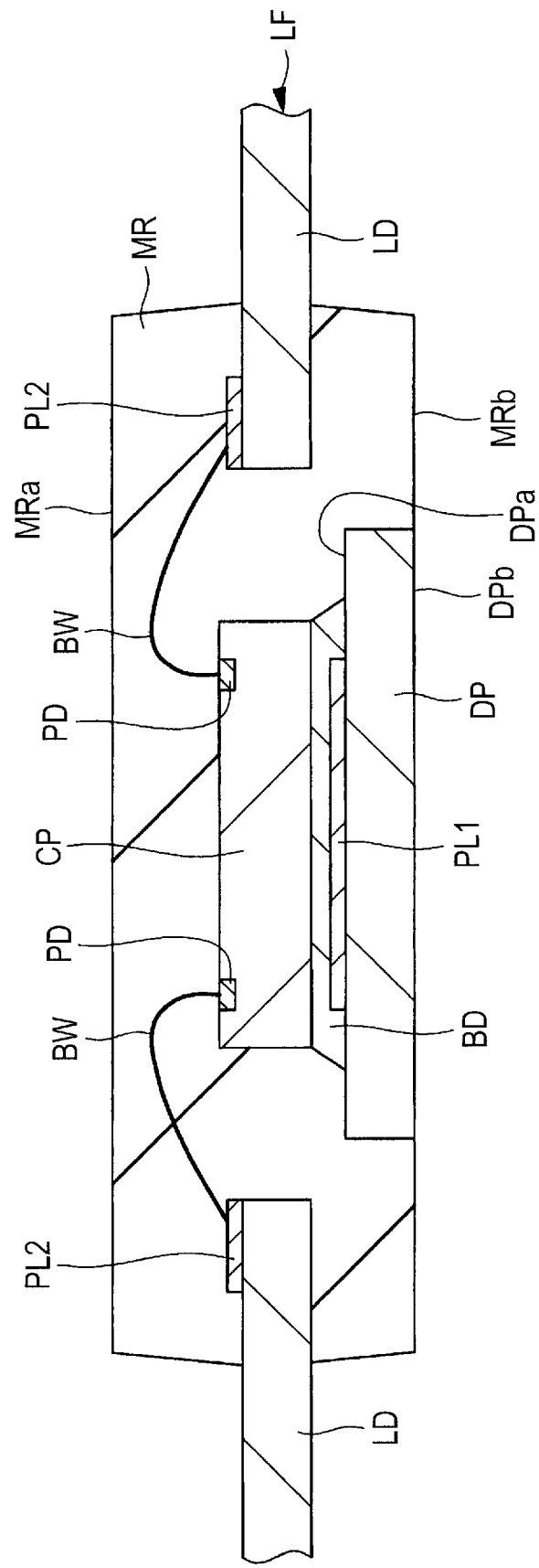
FIG. 17 is a cross-sectional view illustrating the molding process.

Subsequently, resin sealing by a molding process (a resin forming process) is performed, thereby sealing the semiconductor chip CP and the wires BE coupled thereto by the sealing portion MR, as illustrated in FIGS. 16 and 17 (Step S6 in FIG. 9). By the molding process in Step S6, the sealing portion MR is formed, which seals therein the semiconductor chip CP, the die pad DP, the inner lead portions of the leads LD, the wires BW, and the suspension lead TL. Because the plating layer PL1 formed on the top surface DPa of the die pad DP is entirely covered by the bonding material BD, the plating layer PL1 is not in contact with the sealing portion MR even when the sealing portion MR is formed in Step S6. That is, the sealing portion MR is formed by performing the molding process while the plating layer PL1 is not exposed. Therefore, the plating layer PL1 is not in contact with the sealing portion MR. In addition, in a case of FIG. 17, the bottom surface DPb of the die pad DP is exposed from the bottom surface MRb of the sealing portion MR.

Subsequently, plating is performed for the outer lead portions of the leads LD exposed from the sealing portion MR as necessary, and thereafter the leads LD and the suspension lead TL are cut at predetermined positions outside the sealing portion MR to be separated from the framework of the lead frame LF (Step S7 in FIG. 9).

Figure 18:
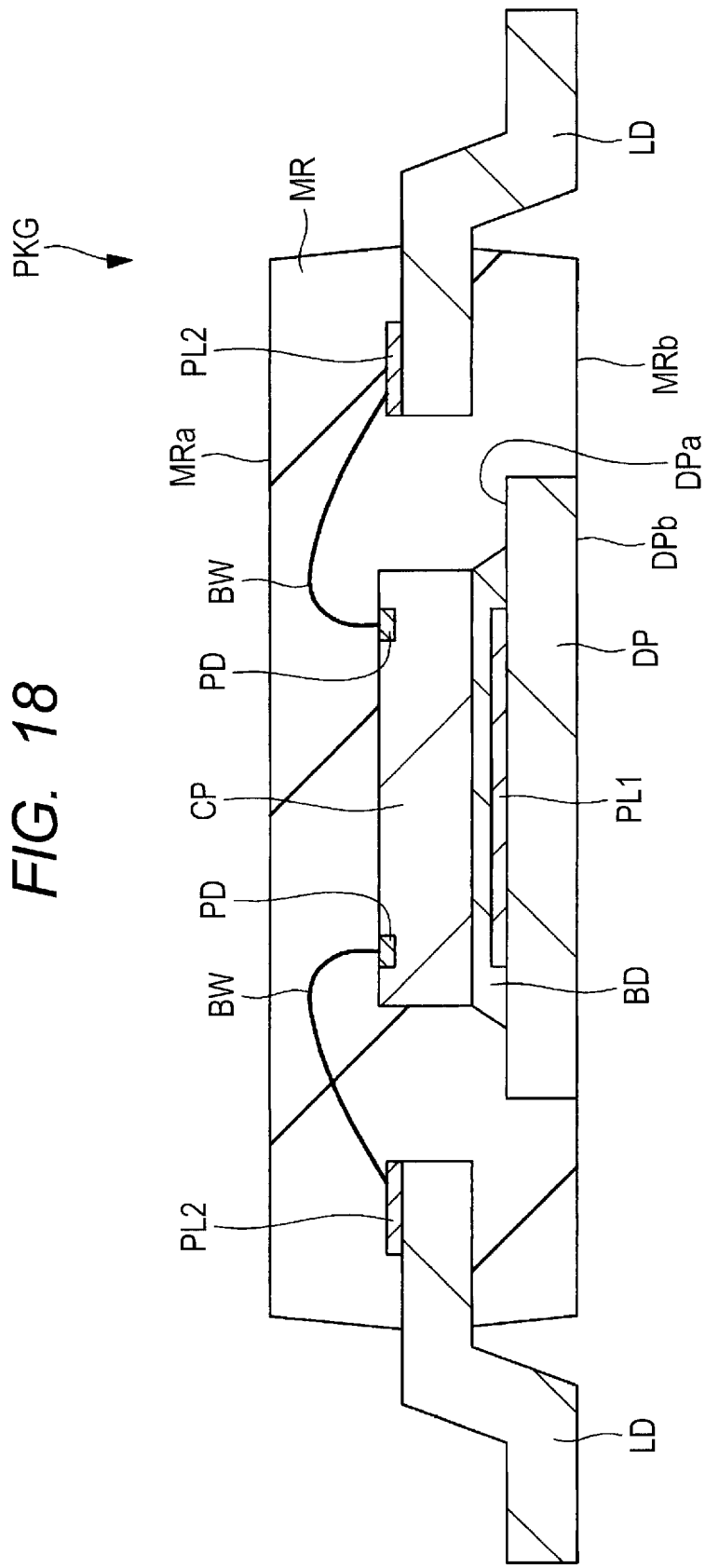
FIG. 18 is a cross-sectional view illustrating a lead forming process.

The outer lead portions of the leads LD, projecting from the sealing portion MR, are then subjected to bending (lead processing, lead forming), as illustrated in FIG. 18 (Step S8 in FIG. 9).

In this manner, the semiconductor device PKG illustrated in FIGS. 1 to 8 is manufactured.

Studied Examples

Figure 19:
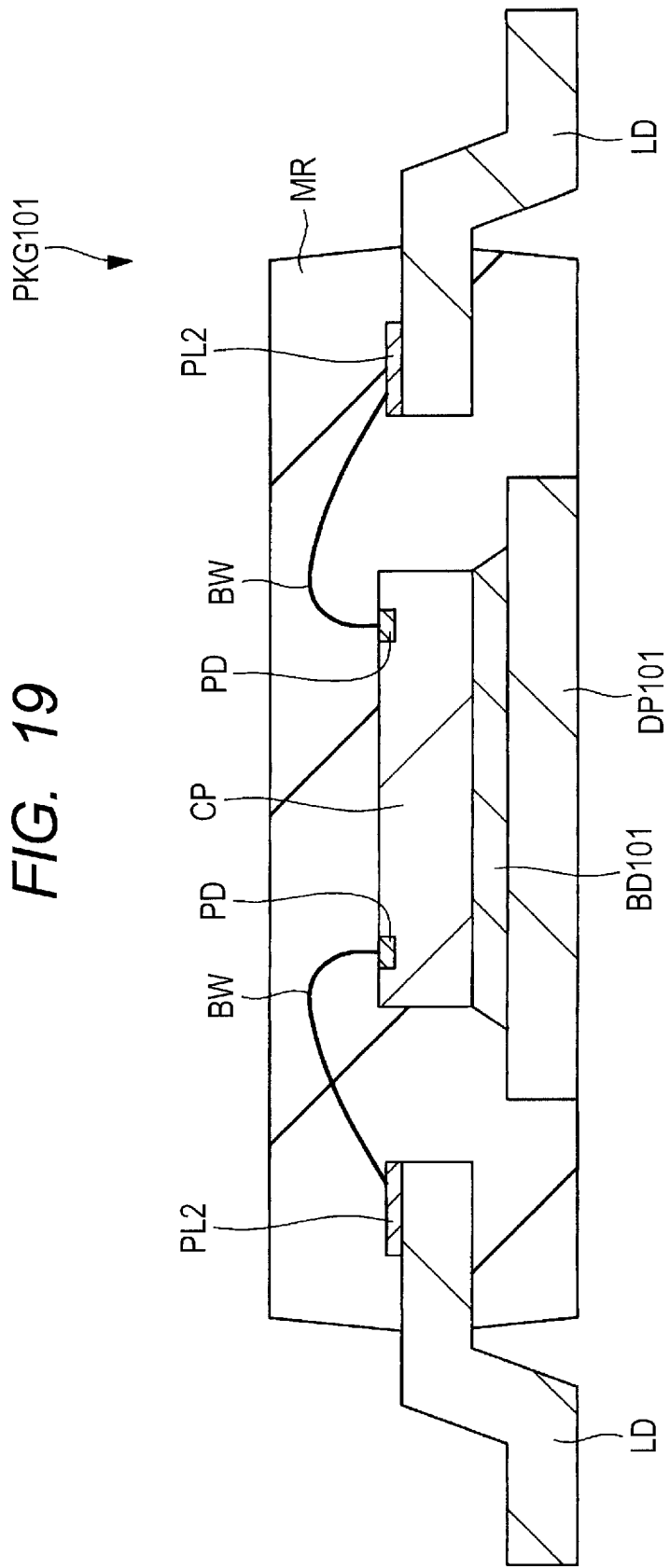
FIG. 19 is a cross-sectional view of a semiconductor device according to a first studied example.

FIG. 19 is a cross-sectional view of a semiconductor device (a semiconductor package) PKG101 of the first studied example studied by the inventors of the present application, and corresponds to FIG. 7.

The semiconductor device PKG101 of the first studied example illustrated in FIG. 19 is different from the semiconductor device PKG of the present embodiment mainly in the following point.

In the semiconductor device PKG101 of the first studied example illustrated in FIG. 19, the semiconductor chip CP is mounted on a die pad DP101 corresponding to the die pad DP via a bonding material BD101 corresponding to the above bonding material BD. However, what corresponds to the above plating layer PL1 is not formed on a top surface of the die pad DP101. Therefore, in the semiconductor device PKG101 of the first studied example illustrated in FIG. 19, the back surface of the semiconductor chip CP is bonded to be fixed on the top surface of the die pad DP101 on which no plating layer is formed, via the bonding material BD101. Another configuration of the semiconductor device PKG101 of the first studied example illustrated in FIG. 19 is approximately the same as the above semiconductor device PKG, and therefore the redundant description is omitted here.

The die pad DP101 is formed of the same or similar material as/to the die pad DP, and is specifically made of a metal material mainly containing copper (copper or copper alloy). Therefore, before the semiconductor chip CP is mounted on the top surface of the die pad DP101 by the die bonding process, a surface (an exposed surface) of the die pad DP101 made of copper or copper alloy may be oxidized. When the top surface of the die pad DP101 is oxidized before the die bonding process, there is an oxide layer (hereinafter referred to as an interface oxide layer) formed at an interface between the bonding material BD101 and the die pad DP101 in a case where the semiconductor chip CP is mounted on the top surface of the die pad DP101 via the bonding material BD101. This interface oxide layer corresponds to an oxide layer formed by oxidation of the exposed surface of the die pad DP101 before the die bonding process. The interface oxide layer is lower in thermal conductivity, as compared with the bonding material BD101 and the die pad DP101. Therefore, the presence of the interface oxide layer at the interface between the bonding material BD101 and he die pad DP 101 acts to increase a thermal resistance of a heat conduction path from the semiconductor chip CP to the die pad DP101.

That is, in the semiconductor device PKG101 of the first studied example illustrated in FIG. 19, the thermal resistance of the heat conduction path from the semiconductor chip CP to the die pad DP101 is a total of the thermal resistance of an interface between the semiconductor chip CP and the bonding material BD101, the thermal resistance of the bonding material BD101, and the thermal resistance of the interface between the bonding material BD101 and the die pad DP101. When the interface oxide layer is formed at the interface between the bonding material BD101 and the die pad DP 101, the thermal resistance of the interface between the bonding material BD101 and the die pad DP101 increases, and in association with this, the thermal resistance of the heat conduction path from the semiconductor chip CP to the die pad DP101 increases.

Therefore, in the semiconductor device PKG101 of the first studied example illustrated in FIG. 19, there is a concern that the presence of the interface oxide layer at the interface between the bonding material BD101 and the die pad DP101 causes the thermal resistance of the heat conduction path from the semiconductor chip CP to the die pad DP101 to increase, resulting in reduction of efficiency of heat dissipation from the semiconductor chip CP to the die pad DP101. When the efficiency of heat dissipation from the semiconductor chip CP to the die pad DP101 is reduced because of increase of the thermal resistance of the heat conduction path from the semiconductor chip CP to the die pad DP101, the temperature of the semiconductor chip CP can easily rise because of heat generation in the semiconductor chip CP. The temperature rise of the semiconductor chip CP leads to lowering of the reliability and the performance of the semiconductor device PKG101. Therefore, it is desirable to suppress the temperature rise of the semiconductor chip CP as small as possible.

Figure 20:
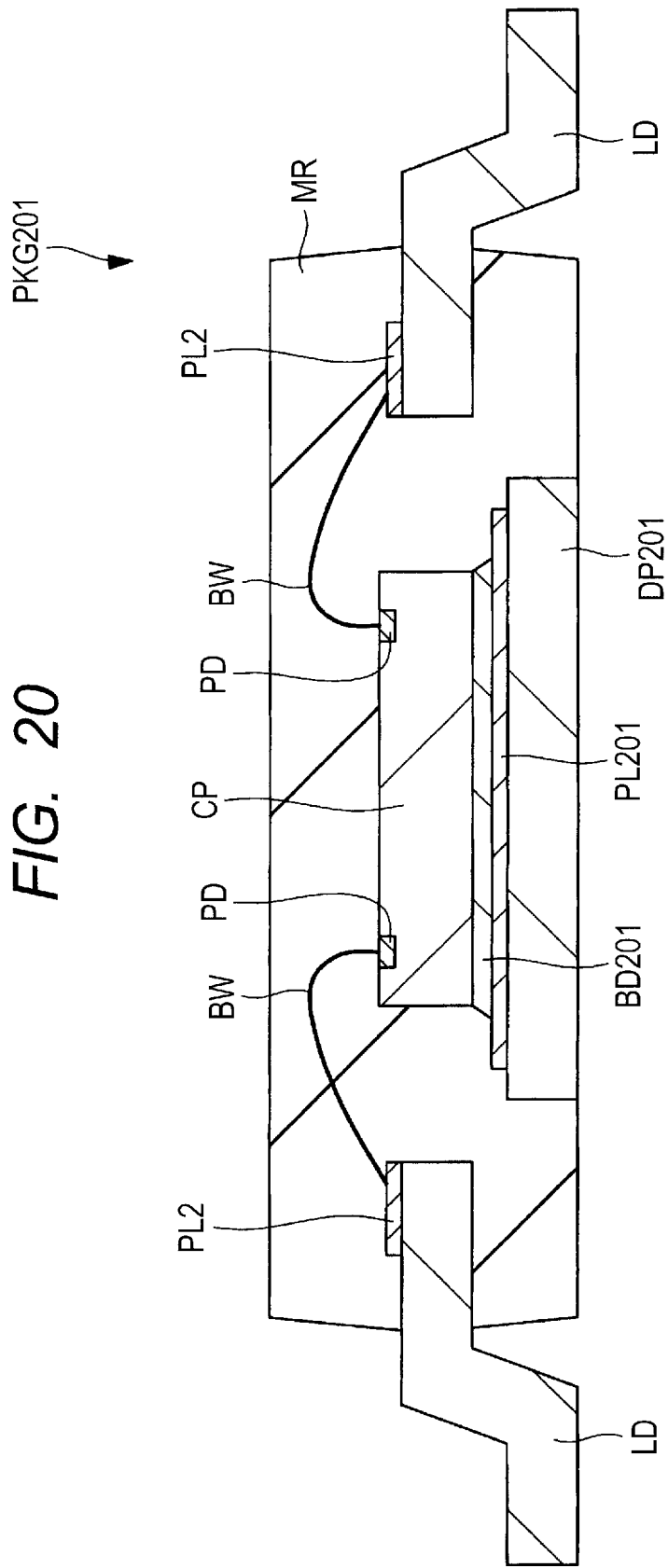
FIG. 20 is a cross-sectional view of a semiconductor device according to a second studied example.
Figure 21:
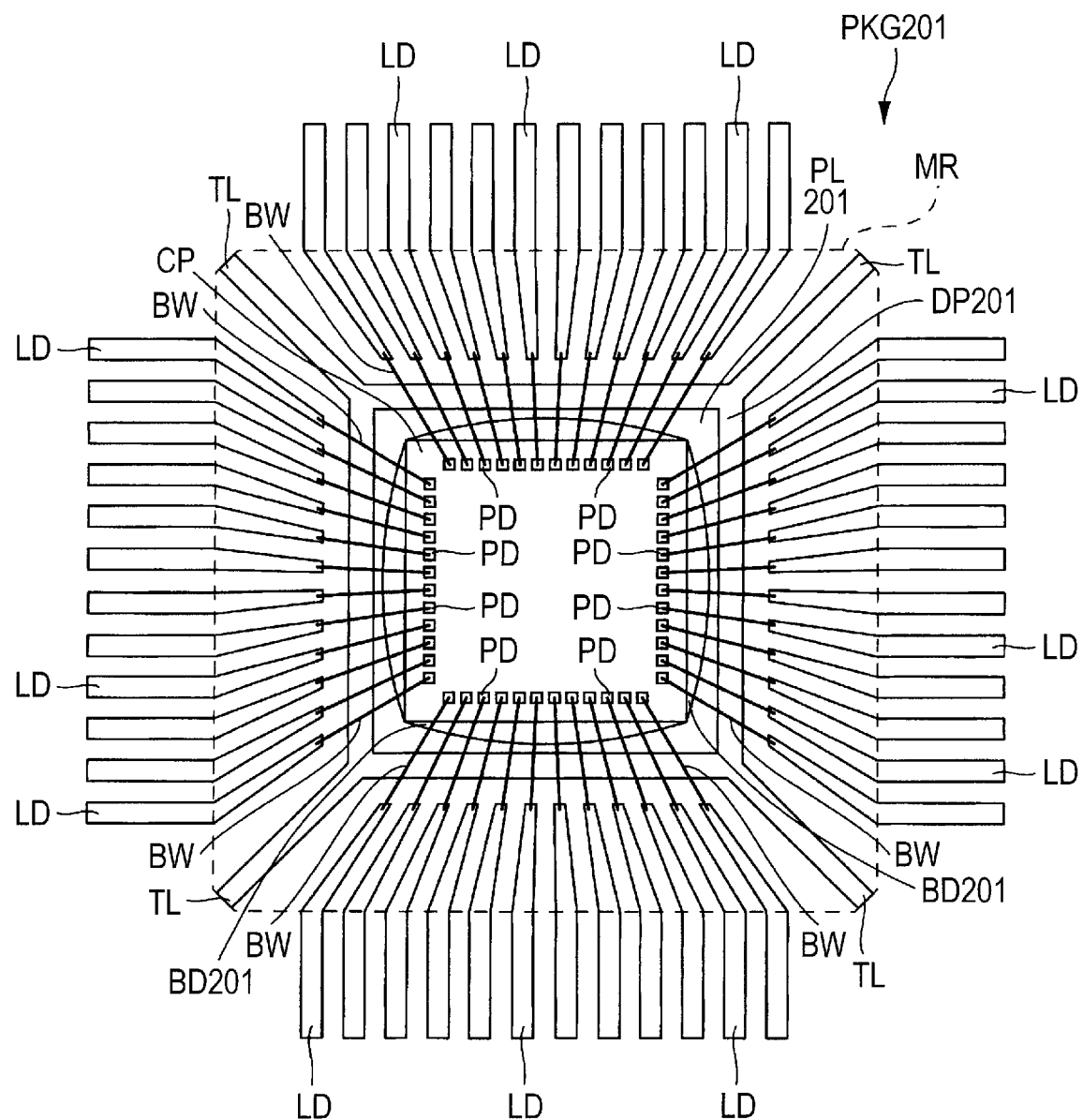
FIG. 21 is a perspective plan view of the semiconductor device according to the second studied example.
Figure 22:
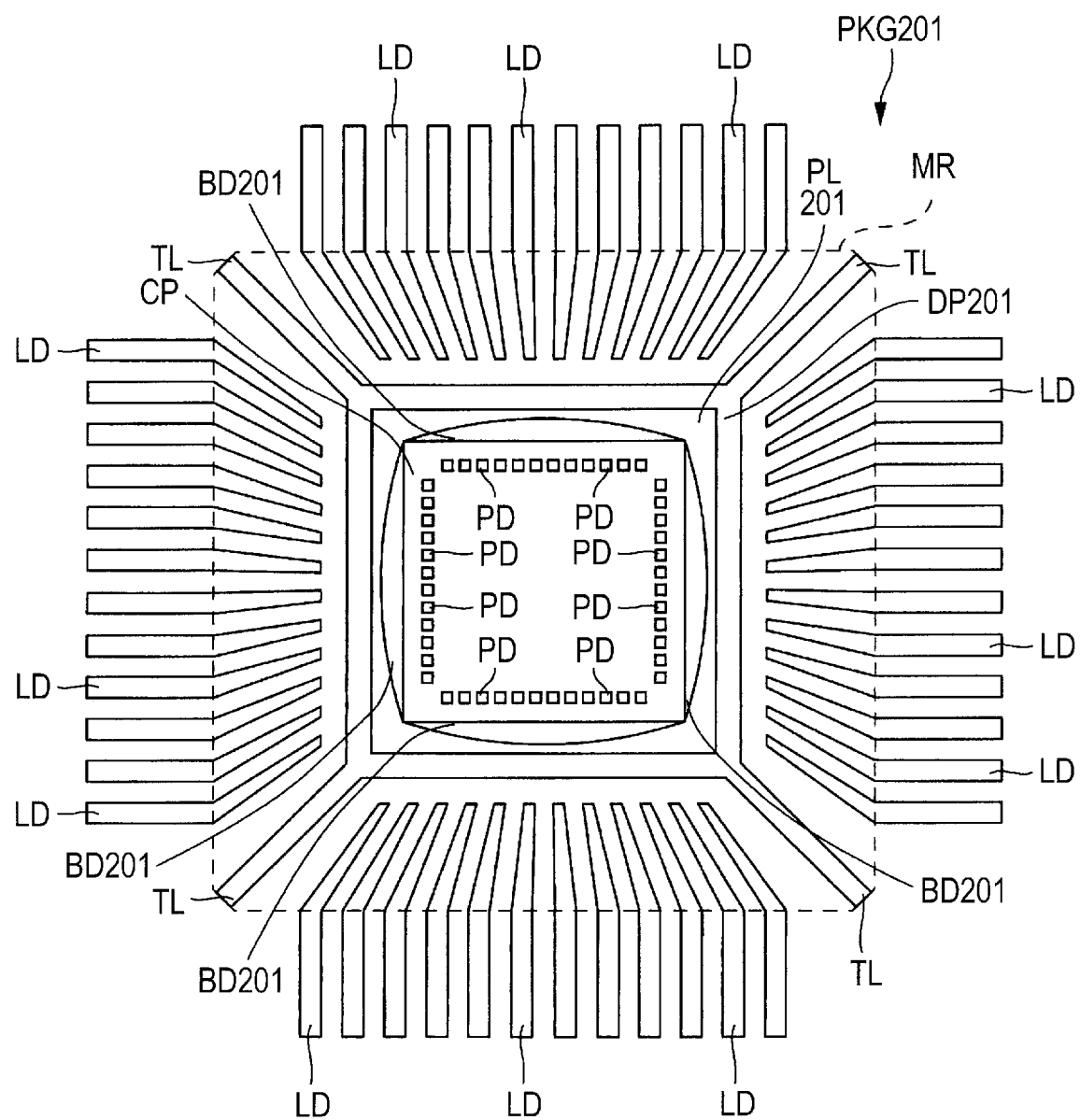
FIG. 22 is a perspective plan view of the semiconductor device according to the second studied example.
Figure 23:
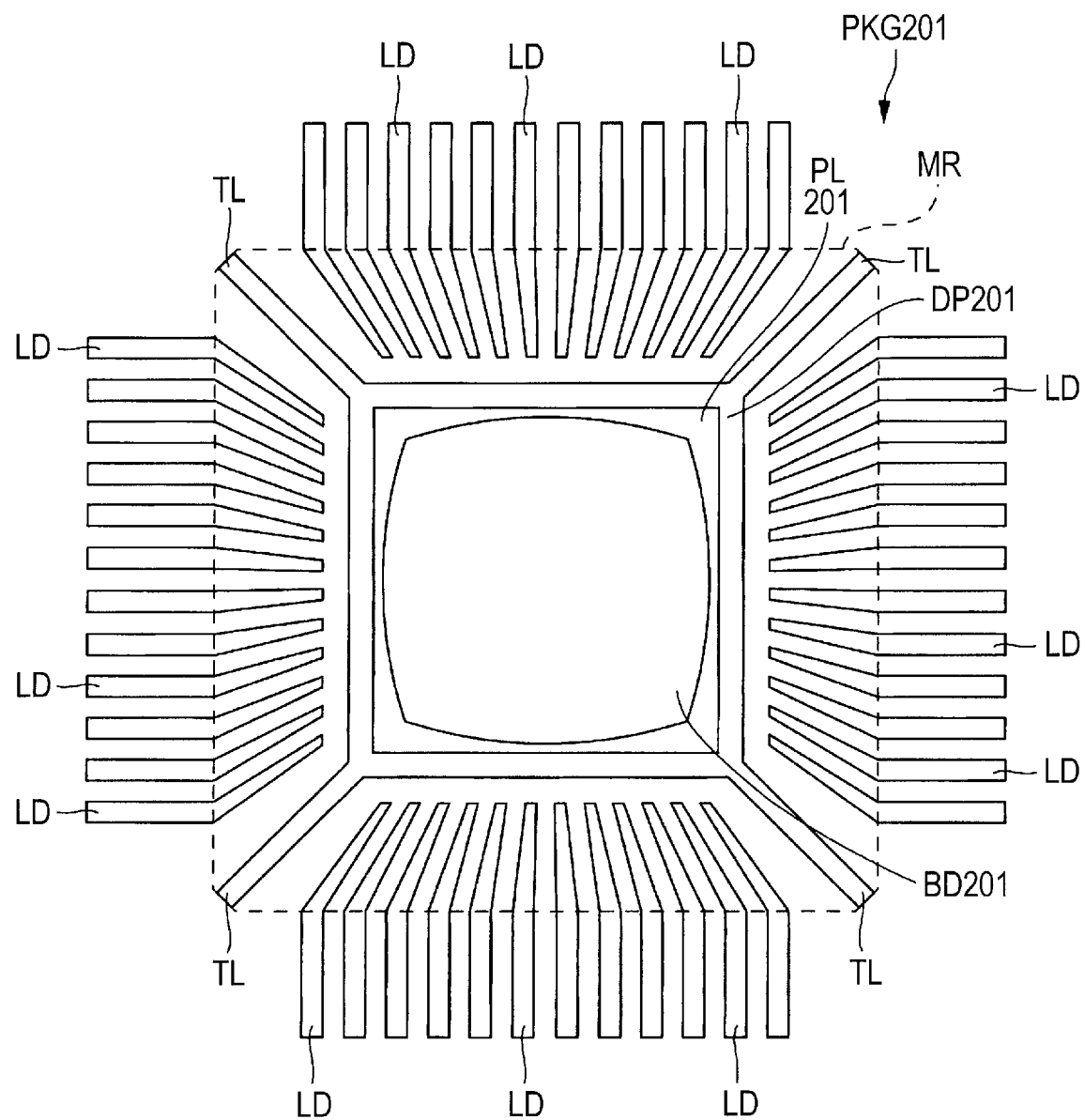
FIG. 23 is a perspective plan view of the semiconductor device according to the second studied example.
Figure 24:
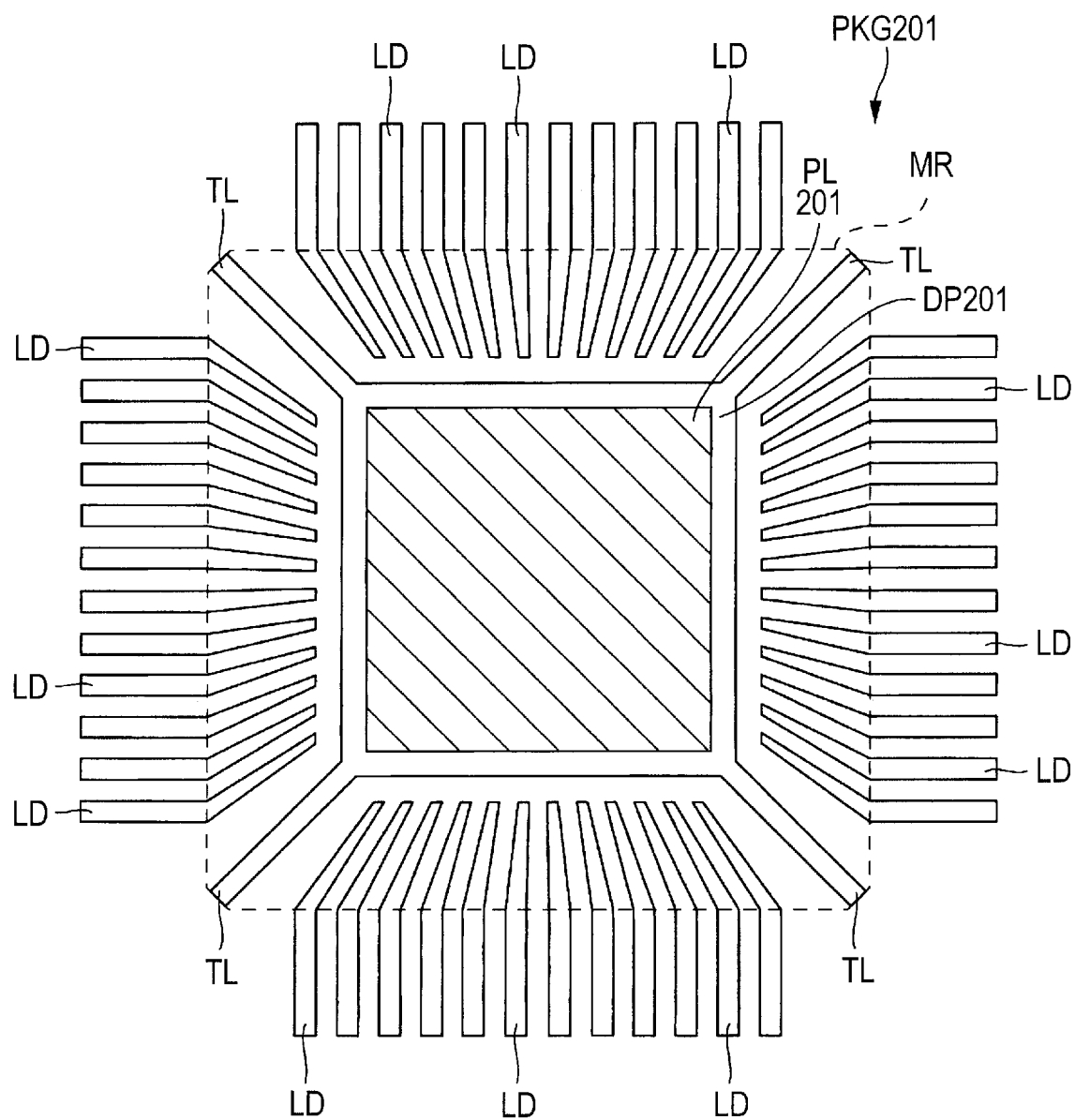
FIG. 24 is a perspective plan view of the semiconductor device according to the second studied example.

FIG. 20 is a cross-sectional view of a semiconductor device (a semiconductor package) PKG201 of the second studied example studied by the inventors of the present application, and corresponds to FIGS. 7 and 19. FIGS. 21 to 24 are perspective plan views of the semiconductor device PKG201 of the second studied example, and correspond to FIGS. 3 to 6, respectively. FIG. 21 illustrates the perspective plan view of the semiconductor device PKG201 when the sealing portion MR is seen through. FIG. 22 illustrates the perspective plan view of the semiconductor device PKG201 when the wire BW is further seen through (is omitted) in FIG. 21. FIG. 23 illustrates the perspective plan view of the semiconductor device PKG201, when the semiconductor chip CP is further seen through (is omitted) in FIG. 22. FIG. 24 illustrates the perspective plan view of the semiconductor device PKG201, when a bonding material BD201 is further seen through (is omitted) in FIG. 23. Although FIG. 24 is a plan view, hatching is added to a plating layer PL201 formed on a top surface of a die pad DP201 for simplifying the understanding.

The semiconductor device PKG201 of the second studied example illustrated in FIGS. 20 to 24 is different from the semiconductor device PKG101 of the first studied example illustrated in FIG. 19 in that the plating layer PL201 is formed on the top surface of the die pad DP201.

That is, in the semiconductor device PKG201 of the second studied example illustrated in FIGS. 20 to 24, the semiconductor chip CP is mounted on the die pad DP201 corresponding to the die pad DP via the bonding material BD201 corresponding to the above bonding material BD, and the plating layer PL201 is formed on the top surface of the die pad DP201. Therefore, in the semiconductor device PKG201 of the second studied example illustrated in FIGS. 20 to 24, the semiconductor chip CP is mounted on the plating layer PL201 on the top surface of the die pad DP201 via the bonding material BD201. That is, the back surface of the semiconductor chip CP is bonded to be fixed to the plating layer PL201 on the top surface of the die pad DP201 via the bonding material BD201.

The plating layer PL201 corresponds to the above plating layer PL1. However, the area of the plating layer PL201 in the semiconductor device PKG201 of the second studied example is different from the area of the above plating layer PL1 in the semiconductor device PKG of the present embodiment, and is larger than the area of the above plating layer PL1. That is, in the semiconductor device PKG201 of the second studied example illustrated in FIGS. 20 to 24, the area of the plating layer PL201 is larger than the area of the semiconductor chip CP, and the semiconductor chip CP is included in the plating layer PL201 in a plan view. In a plan view, none of the semiconductor chip CP and the bonding material BD201 is present on an outer circumferential portion of the plating layer PL201. Therefore, the outer circumferential portion of the plating layer PL201 is in contact with the sealing portion MR. Accordingly, in the semiconductor device PKG201 of the second studied example illustrated in FIGS. 20 to 24, the plating layer PL201 includes a portion covered by the bonding material BD201 (a portion that is in contact with the bonding material BD201) and a portion covered by the sealing portion MR without being covered by the bonding material BD201 (a portion that is in contact with the sealing portion MR).

The die pad DP201 is formed of the same or similar material as/to the die pads DP and DP101. The plating layer PL201 is formed of the same or similar material as/to the above plating layer PL1. Specifically, the plating layer PL201 is made of silver (Ag), gold (Au), or platinum (Pt) as with the above plating layer PL1. Therefore, the plating layer PL201 is also formed of a material that can be hardly oxidized, as with the above plating layer PL1. Accordingly, an exposed surface of the plating layer PL201 is not oxidized, although there is a concern that the exposed surface of the die pad DP101 made of copper or copper alloy is oxidized before the die bonding process. Thus, in a case where the semiconductor chip CP is mounted on the plating layer PL201 on the top surface of the die pad DP201 via the bonding material BD201, an oxide layer (an interface oxide layer) is not interposed at the interface between the bonding material BD201 and the plating layer PL201, so that the surface of the plating layer PL201 is in direct contact with the bonding material BD201. Further, the plating layer PL201 is high in thermal conductivity, because it is formed of silver (Ag), gold (Au), or platinum (Pt). Therefore, in the semiconductor device PKG201 of the second studied example illustrated in FIGS. 20 to 24, the thermal resistance of a heat conduction path from the semiconductor chip CP to the die pad DP201 can be suppressed because the semiconductor chip CP is mounted on the plating layer PL201 on the top surface of the die pad DP201 via the bonding material BD201. Accordingly, it is possible to improve efficiency of heat dissipation from the semiconductor chip (CP) to the die pad (DP101 or DP201) in the semiconductor device PKG201 of the second studied example illustrated in FIGS. 20 to 24, as compared with that in the semiconductor device PKG101 of the first studied example illustrated in FIG. 19.

However, studies by the inventors of the present application have revealed the following problems in the semiconductor device PKG201 of the second studied example illustrated in FIGS. 20 to 24.

In the semiconductor device PKG201 of the second studied example illustrated in FIGS. 20 to 24, a portion of the surface of the plating layer PL201 (a surface of the outer circumferential portion of the plating layer PL201) is covered by the sealing portion MR and is in contact with the sealing portion MR. That is, in the semiconductor device PKG201 of the second studied example illustrated in FIGS. 20 to 24, the area of the plating layer PL201 is larger than the area of the semiconductor chip CP, and therefore a portion of the plating layer PL201 is not covered by the bonding material BD, so that that portion is in contact with the sealing portion MR. In particular, the plating layer PL201 is hardly covered by the bonding material BD in the vicinity of a corner of the semiconductor chip CP in a plan view, and the area of the plating layer PL201 that is in contact with the sealing portion MR tends to increase. However, adhesion between the plating layer PL201 and the sealing portion MR is relatively low. Specifically, adhesion between the plating layer PL201 and the sealing portion MR is lower than adhesion between the surface of the die pad DP201 and the sealing portion MR in a region where the plating layer PL201 is not formed.

Therefore, in the semiconductor device PKG201 of the second studied example illustrated in FIGS. 20 to 24, because of low adhesion in the region where the surface of the plating layer PL201 is in contact with the sealing portion MR, and peeling of the sealing portion MR can easily occur in that region. If peeling of the sealing portion MR occurs at even one position, peeling of the sealing portion MR proceeds from that position as a starting point, so that a peeling region of the sealing portion MR can easily spread. Spreading of peeling of the sealing portion MR causes entrance of moisture through the peeling region of the sealing portion MR, for example, that is, causes lowering of reliability of a semiconductor device. Therefore, it is effective to prevent peeling of the sealing portion MR in order to improve the reliability of a resin-sealed semiconductor device.

As described above, in the semiconductor device PKG201 of the second studied example illustrated in FIGS. 20 to 24, there is a concern that peeling of the sealing portion MR occurs from the region where the surface of the plating layer PL201 and the sealing portion MR are in contact with each other as a starting point, to lower reliability of a semiconductor device. Meanwhile, in the semiconductor device PKG101 of the first studied example illustrated in FIG. 19, there is a concern that the thermal resistance of the heat conduction path from the semiconductor chip CP to the die pad DP101 increases, resulting in reduction of efficiency of heat dissipation from the semiconductor chip CP to the die pad DP101, as described above. This leads to easy temperature increase of the semiconductor chip CP because of heat generation in the semiconductor chip CP, and therefore may lower the reliability and the performance of the semiconductor device PKG101.

<Main Features and Advantageous Effects>

The semiconductor device PKG of the present embodiment includes the semiconductor chip CP, the die pad DP that is a chip mounting portion on which the semiconductor chip CP is mounted, the leads LD, and the sealing portion MR (the sealing body) that seals the semiconductor chip CP, at least a portion of the die pad DP, and at least a portion of the leads LD. The die pad PD and the leads LD are made of a metal material mainly containing copper. The plating layer PL1 is formed on the top surface DPa of the die pad DP, and the plating layer PL1 is formed by a silver plating layer, a gold plating layer, or a platinum plating layer. The semiconductor chip CP is mounted on the plating layer PL1 on the top surface DPa of the die pad DP via the bonding material (the first bonding material) BD. The plating layer PL1 is covered by the bonding material BD not to be in contact with the sealing portion MR.

One of main features of the present embodiment is in that the plating layer PL1 is formed on the top surface DPa of the die pad DP and the semiconductor chip CP is mounted on the plating layer PL1 on the top surface DPa of the die pad DP via the bonding material BD. Therefore, the problems described in association with the above first studied example can be overcome. This is described below.

A case where the plating layer PL1 is not formed on the top surface DPa of the die pad DP unlike the present embodiment substantially corresponds to the semiconductor device PKG101 of the first studied example of FIG. 19. If the plating layer PL1 is not formed on the top surface DPa of the die pad DP unlike the present embodiment, the problems described in association with the semiconductor device PKG101 of the above first studied example may occur. In short, an oxide layer (an interface oxide layer) is present at the interface between the bonding material (BD101) for mounting the semiconductor chip CP and the die pad (DP101), and the thermal resistance of the heat conduction path from the semiconductor chip CP to the die pad (DP101) may increase, resulting in reduction of efficiency of heat dissipation from the semiconductor chip CP to the die pad (DP101).

On the other hand, in the present embodiment, the plating layer PL1 is formed on the top surface DPa of the die pad DP, and is formed by a silver plating layer, a gold plating layer, or a platinum plating layer. The plating layer PL1 can be more hardly oxidized than the die pad DP made of a metal material mainly containing copper, because the plating layer PL1 is formed of a hardly oxidized material (silver (Ag), gold (Au), or platinum (Pt)). Therefore, although there is a concern that the exposed surface of the die pad DP formed of a metal material mainly containing copper is oxidized before the die bonding process, the exposed surface of the plating layer PL1 is not oxidized. Accordingly, in a case where the semiconductor chip CP is mounted on the plating layer PL1 on the top surface of the die pad DP via the bonding material BD, an oxide layer (an interface oxide layer) is not present at the interface between the bonding material BD and the plating layer PL1, so that the surface of the plating layer PL1 is in direct contact with the bonding material BD1. Further, the plating layer PL1 is high in thermal conductivity, because it is formed by a silver (Ag) plating layer, a gold (Au) plating layer, or a platinum (Pt) plating layer. Therefore, in the semiconductor device PKG of the present embodiment, the thermal resistance of the heat conduction path from the semiconductor chip CP to the die pad DP can be suppressed, because the plating layer PL1 is provided on the top surface DPa of the die pad DP and the semiconductor chip CP is mounted on the plating layer PL1 via the bonding material BD. For this reason, the semiconductor device PKG of the present embodiment can improve efficiency of heat dissipation from the semiconductor chip (CP) to the die pad (DP or DP101) more, as compared with that in the semiconductor device PKG101 of the first studied example illustrated in FIG. 19. This can improve reliability of a semiconductor device. Also, this can improve performance of the semiconductor device.

Another one of the main features of the present embodiment is in that the plating layer PL1 is covered by the bonding material BD not to be in contact with the sealing portion MR. Due to this feature, it is possible to overcome the problems described in association with the above second studied example. This is described below.

In the second studied example illustrated in FIGS. 20 to 24, a portion of the surface of the plating layer PL201 (a surface of the outer circumferential portion of the plating layer PL201) is not covered by the bonding material BD201 but is covered by the sealing portion MR, and is in contact with the sealing portion MR. However, because of relatively low adhesion between the plating layer PL201 and the sealing portion MR, there is a concern that peeling of the sealing portion MR can easily occur in a region where the surface of the plating layer PL201 and the sealing portion MR are in contact with each other, and peeling of the sealing portion MR proceeds from that region as a starting point. This lowers reliability of a semiconductor device.

That is, in a case where a portion of the surface of the plating layer PL1 (for example, the surface of the outer circumferential portion of the plating layer PL1) is in contact with the sealing portion MR without being covered by the bonding material BD unlike the present embodiment, there is a concern that the region where the bonding material BD is in contact with the sealing portion MR is a portion where the sealing portion MR can easily peel off, and peeling of the sealing portion MR proceeds from that portion as a starting point.

On the other hand, in the present embodiment, the plating layer PL1 is covered by the bonding material BD not to be in contact with the sealing portion MR. Therefore, the region where the plating layer PL1 and the sealing portion MR are in contact with each other is not formed. That is, because the plating layer PL1 formed on the top surface DPa of the die pad DP is entirely covered by the bonding material BD, the region where the plating layer PL1 is in direct contact with the sealing portion MR is not formed. If there is the region where the plating layer PL1 and the sealing portion MR are in contact with each other, that region can be the starting point of peeling of the sealing portion MR. However, in the present embodiment, the plating layer PL1 and the sealing portion MR are not in contact with each other because the plating layer PL1 formed on the top surface DPa of the die pad DP is entirely covered by the bonding material BD. Therefore, it is possible to prevent a phenomenon that peeling of the sealing portion MR proceeds from the region of contact between the plating layer PL1 and the sealing portion MR as the starting point. Accordingly, the present embodiment can more suitably suppress or prevent peeling of the sealing portion MR as compared with the second studied example of FIGS. 20 to 24, thereby improving reliability of a semiconductor device.

Further, in the present embodiment, it is preferable that the plating layer PL1 is included in the semiconductor chip CP in a plan view. This enables a structure in which the plating layer PL1 is entirely covered by the bonding material BD to be accurately obtained. Specifically, in the die bonding process, an uncured bonding material (BD1) is pressed by the back surface of the semiconductor chip CP to spread. Therefore, after curing the bonding material (BD1), the cured bonding material BD is present below the entire back surface of the semiconductor chip CP. Accordingly, if the planar dimensions (the planar area) of the plating layer PL1 are set to be smaller than the planar dimensions (the planar area) of the semiconductor chip CP and the plating layer PL1 is designed to be included in the semiconductor chip CP in a plan view, the entire plating layer PL1 is inevitably covered by the bonding material BD, so that contact of the plating layer PL1 with the sealing portion MR can be accurately prevented.

In addition, the reason why adhesion between the plating layer PL1 and the sealing portion MR is low in a case where the plating layer PL1 is in contact with the sealing portion MR is that flatness of the surface of the plating layer PL1 is high. That is, flatness of the surface (the top surface) of the plating layer PL1 formed by plating is higher than flatness of the top surface DPa of the die pad DP in a region where the plating layer PL1 is not formed. In other words, surface roughness of the top surface DPa of the die pad DP in the region where the plating layer PL1 is not formed is rougher than that of the surface (the top surface) of the plating layer PL1. This reflects that a film with a highly flat surface (a plating film) is deposited when plating is used. Therefore, if the plating layer PL1 is in contact with the sealing portion MR unlike the present embodiment, adhesion between the plating layer PL1 and the sealing portion MR is lower than adhesion between the top surface DPa of the die pad DP and the sealing portion MR in the region where the plating layer PL1 is not formed. However, in the present embodiment, even if flatness of the surface of the plating layer PL1 is high, contact of the plating layer PL1 having a highly flat surface with the sealing portion MR can be prevented because the entire plating layer PL1 is covered by the bonding material BD. Therefore, it is possible to prevent peeling of the sealing portion MR caused by contact of the plating layer PL1 having the highly flat surface with the sealing portion MR.

If there is a region where adhesion of the sealing portion MR is relatively low, peeling of the sealing portion MR may proceed from that region as an starting point. Therefore, if there is the region where adhesion of the sealing portion MR is relatively low, it is effective to take countermeasures against that region in order to prevent peeling of the sealing portion MR. In the semiconductor device PKG201 of the above second studied example, adhesion between the plating layer PL201 and the sealing portion MR is low. Therefore, in the present embodiment, the entire plating layer PL1 is covered by the bonding material BD, thereby preventing the plating layer PL1 from being in contact with the sealing portion MR.

Further, adhesion between the bonding material BD or BD201 and the sealing portion MR is relatively high, and is higher than adhesion between the plating layer PL201 and the sealing portion MR in the semiconductor device PKG201 of the second studied example. Therefore, in order to prevent peeling of the sealing portion MR, it is effective to cover the entire plating layer PL1 by the bonding material BD as in the present embodiment, to prevent contact of the plating layer PL1 and the sealing portion MR. It is unnecessary to reduce a portion of contact between the bonding material BD and the sealing portion MR in which adhesion is relatively high. One of reasons why adhesion between the bonding material BD and the sealing portion MR is high is that the bonding material BD is formed of a conductive bonding material containing a conductive material and a resin material.

If the bonding material BD is solder unlike the present embodiment, adhesion between solder and the sealing portion MR is relative low. Therefore, even if the entire plating layer PL1 is covered by the bonding material BD to prevent contact of the plating layer PL1 and the sealing portion MR with each other, there is a concern that peeling of the sealing portion MR starts from a portion of contact between solder and the sealing portion MR with each other and proceeds because of low adhesion between solder and the sealing portion MR.

On the other hand, in the present embodiment, solder is not used for the bonding material BD. Instead, a conductive bonding material containing a conductive material and a resin material is used. The sealing portion MR contains a resin material and the bonding material BD also contains a resin material. Thus, adhesion between the bonding material BD and the sealing portion MR is high. Further, thermal conductivity of the bonding material BD is also high because it includes a conductive material. This also acts to suppress the thermal resistance of the heat conduction path from the semiconductor chip CP to the bonding material BD and to improve efficiency of heat dissipation from the semiconductor chip CP to the die pad DP. Therefore, the present embodiment and modified examples described later can provide significantly large effects when being applied to a case where the bonding material BD is formed of a conductive bonding material containing a conductive material and a resin material.

As a bonding material used in die bonding (corresponding to the above bonding material BD1), a conductive paste type bonding material can be suitably used, and silver (Ag) paste is particularly preferable. Silver (Ag) paste contains silver (Ag) particles as a conductive material and a resin material. The bonding material (BD1) is uncured in die bonding, and is therefore in paste form having a viscosity. The paste-like bonding material (BD1) is cured by a heat treatment (baking) after die bonding to be the cured bonding material BD. When a thermosetting resin material is used as the resin material contained in the bonding material BD1, the thermosetting resin material contained in the bonding material is cured by the heat treatment, thereby the bonding material BD1 is cured. Because the cured bonding material BD contains a resin material, adhesion between the bonding material BD and the sealing portion MR is increased, so that peeling of the sealing portion MR hardly occurs at the interface between the sealing portion MR and the bonding material BD.

In addition, as the bonding material BD1 used in die bonding, a paste-like bonding material that contains metal particles (preferably silver (Ag) particles) as a conductive material and a resin material can be used suitably. The metal particles contained in the bonding material BD1 may be sintered by a heat treatment after die bonding (a heat treatment corresponding to Step S4 described above). In this case, the bonding material BD is formed of a sintered metal (a sintered body of metal particles). In a case where the metal particles contained in the bonding material BD1 are silver (Ag) particles, the sintered metal forming the bonding material BD is sintered silver (sintered Ag). In this case, almost no resin material is left in the bonding material BD formed of the sintered metal (preferably sintered silver). However, because there are a number of gaps in the sintered metal, the resin material forming the sealing portion MR can enter into the gaps in the bonding material BD formed of the sintered metal when the sealing portion MR is formed by molding. Therefore, adhesion between the bonding material BD formed of the sintered metal (preferably sintered silver) and the sealing portion MR is relatively high, and is specifically higher than adhesion between the plating layer PL201 and the sealing portion MR in the semiconductor device PKG201 of the second studied example, and than adhesion between solder and the sealing portion MR in a case of using solder as the bonding material BD. Therefore, the present embodiment and the modified examples described later can provide significantly large effects, also when being applied to a case where the bonding material BD is formed of a sintered metal (preferably sintered silver).

Accordingly, a case where the bonding material BD is formed of a conductive bonding material containing a conductive material (preferably metal particles, such as silver particles) and a resin material and a case where the bonding material BD is formed of a sintered metal (preferably sintered silver) are preferable, because adhesion between the bonding material BD and the sealing portion MR is high in both the cases. For this reason, use of a conductive bonding material that contains a conductive material (preferably metal particles, such as silver particles) and a resin material as the bonding material BD1 is preferable, because high adhesion between the bonding material BD and the sealing portion MR is obtained.

Note that in a case of using solder in die bonding, solder is melted once and is thereafter solidified. Therefore, solder does not correspond to a sintered metal. Also, solder does not correspond to a conductive bonding material containing a conductive material and a resin material. Solder solidified after being melted includes no gap therein unlike a sintered body, and does not include a resin material. Therefore, adhesion between solder and a resin sealing portion is lower than adhesion between a sintered metal and the resin sealing portion or adhesion between a conductive bonding material that contains a conductive material and a resin material and the resin sealing portion. Accordingly, in the present embodiment and the modified examples described later, it is preferable to use a conductive bonding material that contains a conductive material (preferably metal particles, such as silver particles) and a resin material, or a sintered metal (preferably sintered silver) as the bonding material BD, instead of solder, as described above.

The bottom surface DPb of the die pad DP may be exposed from the bottom surface MRb of the sealing portion MR or may not be exposed. In a case where the bottom surface DPb of the die pad DP is exposed from the bottom surface MRb of the sealing portion MR, heat conducted from the semiconductor chip CP to the die pad DP can be dissipated to the outside of the semiconductor device PKG from the bottom surface DPb of the die pad DP exposed from the bottom surface MRb of the sealing portion MR. Therefore, in the semiconductor device in which the bottom surface DPb of the die pad DP is exposed from the bottom surface MRb of the sealing portion MR, it is important to lower the thermal resistance of the heat conduction path from the semiconductor chip CP to the die pad DP as much as possible. Lowering of the thermal resistance enables heat generated in the semiconductor chip CP to be efficiently dissipated to the outside of the semiconductor device through the die pad DP, thereby improving the heat dissipating property of the semiconductor device. Accordingly, the present embodiment and the modified examples described later that can suppress the thermal resistance of the heat conduction path from the semiconductor chip CP to the die pad DP by providing the plating layer PL1 can provide significantly large effects, when being applied to a case where the bottom surface DPb of the die pad DP is exposed from the bottom surface MRb of the sealing portion MR.

As described above, it is preferable that the planar dimensions (the planar area) of the plating layer PL1 are set to be smaller than the planar dimensions (the planar area) of the semiconductor chip CP and the plating layer PL1 is designed to be included in the semiconductor chip CP in a plan view. This configuration enables the structure in which the entire plating layer PL1 is covered by the bonding material BD to be accurately obtained. However, the plating layer PL1 is provided for suppressing the thermal resistance of the heat conduction path from the semiconductor chip CP to the die pad DP. Therefore, if the planar dimensions (the planar area) of the plating layer PL1 are set to be excessively small, the effect of suppressing the thermal resistance of the heat conduction path from the semiconductor chip CP to the die pad DP by providing the plating layer PL1, becomes small. For this reason, it is desirable that the planar dimensions (the planar area) of the plating layer PL1 are large to some extent. Specifically, the area of the plating layer PL1 is preferably 70% or more of the area of the semiconductor chip CP. With this configuration, the area of overlapping the semiconductor chip CP and the plating layer PL1 each other in a plan view can be ensured to some extent. Therefore, it is possible to accurately achieve the effect of suppressing the thermal resistance of the heat conduction path from the semiconductor chip CP to the die pad DP by providing the plating layer PL1.

In addition, a region of the semiconductor chip CP, where heat generation occurs, is the circuit forming region CC of the semiconductor chip CP. The circuit forming region CC corresponds to a region of the semiconductor chip CP, where various types of circuits (semiconductor integrated circuits) are formed. In the circuit forming region CC of the semiconductor chip CP, a semiconductor element, such as a MISFET (Metal Insulator Semiconductor Field Effect Transistor), is formed. Therefore, it is desirable to allow heat generated in the circuit forming region CC of the semiconductor chip CP to be easily conducted to the die pad DP through the bonding material BD and the plating layer PL1. From this viewpoint, it is preferable that the circuit forming region CC of the semiconductor chip CP is included in the plating layer PL1 in a plan view. In this case, a multilayer structure of the bonding material BD and the plating layer PL1 is located directly below the circuit forming region CC of the semiconductor chip CP. Therefore, heat generated in the circuit forming region CC of the semiconductor chip CP can be efficiently conducted to the die pad DP through the bonding material BD and the plating layer PL1, so that efficiency of heat dissipation from the semiconductor chip CP to the die pad DP can be efficiently improved. Accordingly, it is more preferable that the planar dimensions (the planar area) of the plating layer PL1 are set to be smaller than the planar dimensions (the planar area) of the semiconductor chip CP and be larger than the planar dimensions (the planar area) of the circuit forming region CC of the semiconductor chip CP to allow the plating layer PL1 to be included in the semiconductor chip CP and allow the circuit forming region CC of the semiconductor chip CP to be included in the plating layer PL1 in a plan view. In this case, it is accurately obtain a structure in which the entire plating layer PL1 is covered by the bonding material BD, and is also possible to efficiently improve efficiency of heat dissipation from the semiconductor chip CP to the die pad DP.

In the die bonding process, the mounting position of the semiconductor chip CP may be slightly shifted from a designed position. It is more preferable that also in that case, the mounted semiconductor chip CP includes the plating layer PL1 in a plan view. That is, it is more preferable to design the plating layer PL1 with a margin for a positional shift of the semiconductor chip CP in die bonding ensured to some extent. From this viewpoint, it is more preferable to set an interval K1 between the outer circumference (the side forming the outer circumference) of the semiconductor chip CP and the outer circumference (the side forming the outer circumference) of the plating layer PL1 to about 0.1 mm or more (that is, $K1 \geq 0.1$ mm). In other words, it is more preferable that the outer peripheral edge portion of the plating layer PL1, which is located on the inner side of the outer peripheral edge portion of the semiconductor chip CP, is located on the inner side of that outer peripheral edge portion by 0.1 mm or more. With this configuration, the mounted semiconductor chip CP can easily include the plating layer PL1 in a plan view even if the positional shift of the semiconductor chip CP occurs in die bonding. This makes management of the die bonding process easier, and enables the manufacturing process of the semiconductor device to be easily performed. Further, the manufacturing yield of the semiconductor device can be improved. Note that the interval K1 is illustrated in FIG. 8.

Further, in a case where the plating layer PL201 and the sealing portion MR are in contact with each other as in the second studied example, unlike the present embodiment, when peeling occurs at the interface between the plating layer PL201 and the sealing portion MR and proceeds from a position of occurrence of peeling as a staring point, that peeling may reach the interface between the semiconductor chip CP and the sealing portion MR, causing peeling at the interface between the semiconductor chip CP and the sealing portion MR. Occurrence of peeling at the interface of the semiconductor chip CP and the sealing portion MR largely affects the semiconductor chip CP. Therefore, it is important to prevent occurrence of such peeling as much as possible in order to improve reliability of a semiconductor device (a semiconductor package). Accordingly, it is significantly important to prevent occurrence of a portion where adhesion of the sealing portion MR is low at an interface of the sealing portion MR that is continuous with the interface between the semiconductor chip CP and the sealing portion MR, in order to accurately prevent peeling at the interface between the semiconductor chip CP and the sealing portion MR to improve reliability of a semiconductor device.

Thus, in the present embodiment, contact of the bonding material BD and the sealing portion MR with each other is prevented in order not to form a portion where adhesion of the sealing portion MR is low at an interface of the sealing portion MR that is continuous with the interface between the semiconductor chip CP and the sealing portion MR. Also, the bonding material BD is contrived, and the die pad DP is roughened in the modified examples described later. With these contrivances, it is possible to improve adhesion of the sealing portion MR entirely at the interface of the sealing portion MR that is continuous with the interface between the semiconductor chip CP and the sealing portion MR. Therefore, it is possible to accurately prevent peeling of the sealing portion MR that causes peeling at the interface between the semiconductor chip CP and the sealing portion MR, thereby improving reliability of a semiconductor device accurately.

In a case where the bottom surface DPb of the die pad DP is exposed from the bottom surface MRb of the sealing portion MR, the interface between the die pad DP and the sealing portion MR is exposed in the bottom surface MRb of the sealing portion MR. In this case, it is significantly important to prevent peeling of the sealing portion MR that causes peeling at the interface between the semiconductor chip CP and the sealing portion MR in order to prevent moisture from entering from the interface between the die pad DP and the sealing portion MR to be conducted to the semiconductor chip CP. Also with regard to this point, the present embodiment and the modified example described below can provide significantly large effects, when being applied to a case where the bottom surface DPb of the die pad DP is exposed from the bottom surface MRb of the sealing portion MR.

Modified Examples

If there is a portion where adhesion of the sealing portion MR is relatively low, peeling of the sealing portion MR may proceed from that portion as a starting point. Therefore, if there is the region where adhesion of the sealing portion MR is relatively low, it is effective to take countermeasures against that region in order to prevent peeling of the sealing portion MR. In the present embodiment, because contact between the plating layer PL1 and the sealing portion MR is prevented by covering the entire plating layer PL1 by the bonding material BD, it is not necessary to consider adhesion between the plating layer PL1 and the sealing portion MR. In addition, adhesion between the bonding material BD and the sealing portion MR can be increased by using a conductive bonding material containing a conductive material (preferably metal particles, such as silver particles) and a resin material or a sintered metal (preferably sintered silver) as the bonding material BD, as described above. Therefore, the countermeasure for the plating layer PL1 and the bonding material BD in order to prevent peeling of the sealing portion MR is taken. Accordingly, if adhesion between the surface of the die pad DP in a region where the plating layer PL1 is not formed and the sealing portion MR can be improved, the effect of preventing peeling of the sealing portion MR can be further enhanced.

Thus, a semiconductor device PKG (PKG1) of a modified example, in which the countermeasure for improving adhesion between the surface of the die pad DP in the region where the plating layer PL1 is not formed and the sealing portion MR, is described below with reference to FIG. 25.

Figure 25:
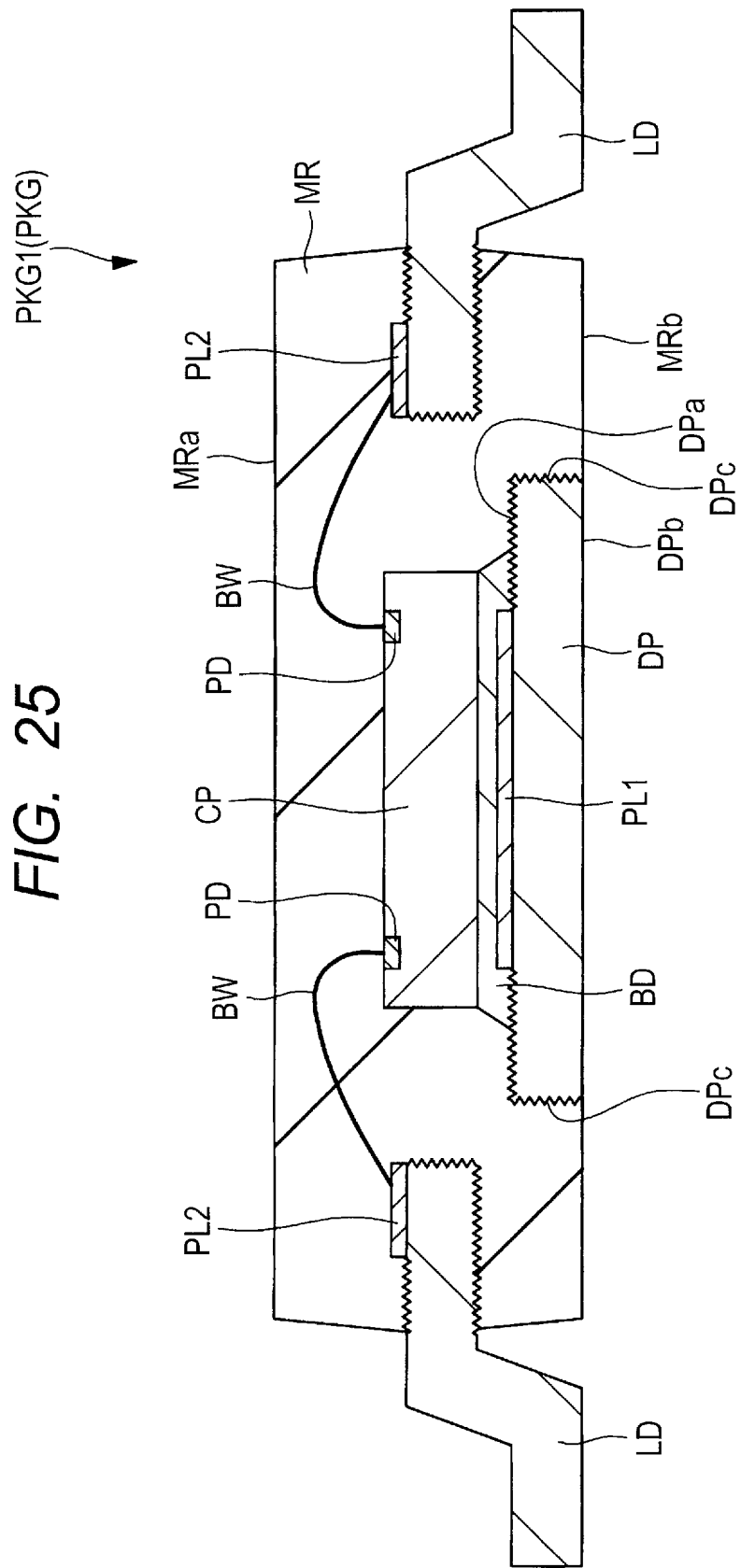
FIG. 25 is a cross-sectional view of a semiconductor device according to a modified example.

FIG. 25 is a cross-sectional view illustrating the modified example of the semiconductor device PKG of the present embodiment, and corresponds to FIG. 7. FIG. 25 schematically illustrates a roughened region in the die pad DP and the lead LD by using fine concave and convex portions. The semiconductor device PKG of the modified example illustrated in FIG. 25 is referred to as a semiconductor device PKG1 by adding the reference sign PKG1 in the following description.

The semiconductor device PKG1 of the modified example illustrated in FIG. 25 is different from the semiconductor device PKG of FIGS. 1 to 8 in the following point.

That is, in the semiconductor device PKG1 of the modified example illustrated in FIG. 25, a surface of a portion of the die pad DP, which is in contact with the sealing portion MR, is subjected to a roughening treatment. Also, in the semiconductor device PKG1 of the modified example illustrated in FIG. 25, a surface of a portion of the lead LD, which is in contact with the sealing portion MR, is subjected to the roughening treatment. That is, the surface (the top surface and the side surfaces) of the die pad DP and the surface (the top surface, the side surfaces, and the bottom surface) of the inner lead portion of the lead LD are subjected to the roughening treatment. Another configuration of the semiconductor device PKG1 of the modified example illustrated in FIG. 25 is approximately the same as the above semiconductor device PKG illustrated in FIGS. 1 to 8, and therefore the redundant description is omitted here.

In a case of manufacturing the semiconductor device PKG1 of the modified example illustrated in FIG. 25, the lead frame LF can be prepared in the following manner.

The lead frame LF is manufactured by processing a metal plate (a copper plate or a copper alloy plate). Thereafter, the plating layer PL1 on the top surface of the die pad DP of the lead frame LF and the plating layer PL2 on the top surface of the inner lead portion of the lead LD of the lead frame LF are formed by plating (preferably electrolytic plating), and then the lead frame LF is subjected to the roughening treatment. In this manner, the lead frame LF subjected to the roughening treatment and provided with the plating layers PL1 and PL2 therein is prepared.

Alternatively, after the lead frame LF is manufactured by processing a metal plate (a copper plate or a copper alloy plate), the roughening treatment is performed for the lead frame LF. Thereafter, the plating layer PL1 on the top surface of the die pad DP of the lead frame LF and the plating layer PL2 on the top surface of the inner lead portion of the lead LD of the lead frame LF are formed by plating (preferably electrolytic plating). In this manner, the lead frame LF subjected to the roughening treatment and provided with the plating layers PL1 and PL2 therein is prepared.

The roughening treatment increases the surface roughness of an object (an object surface), and can be performed by etching, for example. As the index indicating the degree of the surface roughness, an arithmetic average roughness (Ra) is known, for example. The arithmetic average roughness (Ra) can be suitably used as the index indicating the surface roughness, also in the present embodiment and the modified examples.

Either of the process of forming the plating layers PL1 and PL2 (the plating process) and the roughening process may be performed prior to the other. In a case where the roughening process is performed after the process of forming the plating layers PL1 and PL2 (the plating process), the top surface of the die pad DP directly below the plating layer PL1 is not roughened. Also, the top surface of the lead LD (the inner lead portion) directly below the plating layer PL2 is not roughened.

In a case where the roughening process is performed after the process of forming the plating layers PL1 and PL2 (the plating process), the plating layers PL1 and PL2 are exposed to a chemical used for roughening (for example, etchant). However, the plating layers PL1 and PL2 that are formed of silver (Ag), gold (Au), or platinum (Pt) are hardly etched by that chemical, as compared with the lead frame LF formed of a metal material mainly containing copper. Therefore, the plating layers PL1 and PL2 are hardly affected by the roughening treatment, so that the surface of the die pad DP in a region not covered by the plating layer PL1 and the surface of the inner lead portion of the lead LD in a region not covered by the plating layer PL2 are selectively roughened. Because the plating layers PL1 and PL2 are hardly affected by the roughening treatment, any inconvenience does not occur when a wire is coupled to the plating layer PL2 later.

Meanwhile, in a case where the process of forming the plating layers PL1 and PL2 (the plating process) is performed after the roughening process, the top surface of the die pad DP directly below the plating layer PL1 is also roughened, and the top surface of the lead LD (the inner lead portion) directly below the plating layer PL2 is also roughened. In the case of forming the plating layers PL1 and PL2 after the roughening treatment, the plating layers PL1 and PL2 are formed on a roughened surface. Even in that case, flatness of the surfaces of the plating layers PL1 and PL2 formed by plating is high to some extent. Therefore, any inconvenience does not occur when a wire is coupled to the plating layer PL2 later.

In a case of manufacturing the semiconductor device PKG1 of the modified example illustrated in FIG. 25, a region of the die pad DP, which is to be covered by the sealing portion MR, is roughened in the lead frame LF prepared in Step S1. Also, a region of the lead LD, which is to be covered by the sealing portion MR, is roughened in the lead frame LF prepared in Step S1. In the lead frame LF prepared in Step S1, it is preferable that a region of each of the die pad DP and the lead LD, which is to be exposed without being covered by the sealing portion MR, is not roughened.

Except for the roughening treatment performed for the lead frame LF, the manufacturing process of the semiconductor device PKG1 of the modified example illustrated in FIG. 25 is approximately the same as the above manufacturing process described with reference to FIGS. 9 to 18, and therefore the redundant description is omitted here.

The surface of the die pad DP, which is in contact with the sealing portion MR, has higher adhesion with the sealing portion MR in a case where that surface is roughened than in a case where that surface is not roughened and is flat to some extent. This is the same for the lead LD.

In the semiconductor device PKG1 of the modified example illustrated in FIG. 25, a region of the die pad DP, which is to be in contact with the sealing portion MR, is roughened. Specifically, the entire side surfaces of the die pad DP and a region of the top surface DPa of the die pad DP, where the plating layer PL1 is not formed, are roughened. Because of this configuration, it is possible to improve adhesion between the die pad DP and the sealing portion MR in the region where the die pad DP and the sealing portion MR are in contact with each other. Therefore, the effect of preventing peeling of the sealing portion MR can be further enhanced. Because the top surface DPa of the die pad DP in the region covered by the plating layer PL1 is not in contact with the sealing portion MR, it may be roughened or not be roughened.

In addition, in the semiconductor device PKG1 of the modified example illustrated in FIG. 25, a region of the lead LD, which is to be in contact with the sealing portion MR, is roughened. Specifically, the top surface, the side surfaces, and the bottom surface of the inner lead portion of the lead LD are roughened. Because of this configuration, it is possible to improve adhesion between the lead LD and the sealing portion MR. Because the top surface of the lead LD (the inner lead portion) in the region covered by the plating layer PL2 is not in contact with the sealing portion MR, it may be roughened or not be roughened.

Further, it is preferable that the outer lead portion of the lead LD is not roughened. This is because, if the outer lead portion of the lead LD is also roughened in the lead frame LF, a resin material adheres to the outer lead portion of the lead LD of the lead frame LF as resin burrs when the sealing portion MR is formed in the molding process, and those resin burrs can be hardly removed. By roughening the inner lead portion and leaving the outer lead portion unroughened in each lead LD, it is possible to enhance adhesion between the inner lead portion of the lead LD and the sealing portion MR and is also possible to prevent the resin burrs from being left in the outer lead portion of the lead LD.

In addition, while it is preferable to roughen a portion of the die pad DP, which is to be in contact with the sealing portion MR when the sealing portion MR is formed, it is preferable not to roughen a portion that is to be exposed without being covered by the sealing portion MR even when the sealing portion MR is formed. That is, in a case where the bottom surface DPb of the die pad DP is exposed from the bottom surface MRb of the sealing portion MR, as in the semiconductor device PKG1 of the modified example of FIG. 25, it is preferable not to roughen the bottom surface DPb of the die pad DP. This is because, if the portion of the die pad DP of the lead frame LF, which is to be exposed without being covered by the sealing portion MR even when the sealing portion MR is formed, (the bottom surface DPb of the die pad DP here) is also roughened, the resin burrs during formation of the sealing portion MR adhere to that roughened portion, and it is difficult to remove those resin burrs. Therefore, in the die pad DP, the portion that is to be covered by the sealing portion MR when the sealing portion MR is formed is roughened, but the portion that is to be exposed without being covered by the sealing portion MR (the bottom surface DPb of the die pad DP here) is not roughened. With this configuration, it is possible to increase adhesion between the die pad DP and the sealing portion MR, and is also possible to easily prevent the resin burrs from being left on the exposed surface of the die pad DP (the bottom surface DPb of the die pad DP here).

Further, in a case where the bottom surface DPb of the die pad DP is covered by the sealing portion MR and therefore is not exposed, it is preferable to roughen the bottom surface DPb of the die pad DP. In this manner, adhesion between the bottom surface DPb of the die pad DP and the sealing portion MR can be increased.

In the die pad DP and the lead LD, the roughened region is rougher in a surface roughness than the unroughened region.

Therefore, in the semiconductor device PKG1 of the modified example, the surface roughness of the region of the top surface DPa of the die pad DP, where the plating layer PL1 is not formed, is rougher than the surface roughness of the region of the lead LD, which is exposed from the sealing portion MR (the outer lead portion). Also, the surface roughness of the side surface of the die pad DP is rougher than the surface roughness of the region of the lead LD, which is exposed from the sealing portion MR (the outer lead portion). With this configuration, it is possible to improve adhesion between the die pad DP and the sealing portion MR and is also possible to easily prevent the resin burrs from being left in the outer lead portion of the lead LD. Further, the surface roughness of the region of the lead LD, which is covered by the sealing portion MR, (the inner portion) is rougher than the surface roughness of the region of the lead LD, which is exposed from the sealing portion MR, (the outer lead portion). With this configuration, it is possible to improve adhesion between the lead LD and the sealing portion MR and is also possible to easily prevent the resin burrs from being left in the outer lead portion of the lead LD.

A plating layer (an outer plating layer) may be formed on a surface of the region of the lead LD, which is exposed from the sealing portion MR (the outer lead portion). In this case, the surface roughness of the region of the lead LD, which is exposed from the sealing portion MR, (the outer lead portion) is not the surface roughness of the outer plating layer, but is the surface roughness of the lead LD underlying the outer plating layer (the lead LD mainly containing copper) itself.

In addition, in a case where the bottom surface DPb of the die pad DP is exposed from the bottom surface MRb of the sealing portion MR, it is preferable not to roughen the bottom surface DPb of the die pad DP, as described above. In that case, the surface roughness of the region of the top surface DPa of the die pad DP, where the plating layer PL1 is not formed, and the surface roughness of the side surfaces of the die pad DP are rougher than the surface roughness of the bottom surface DPb of the die pad DP. With this configuration, it is possible to improve adhesion between the die pad DP and the sealing portion MR and is also possible to easily prevent the resin burrs from being left on the bottom surface DPb of the die pad DP. Further, the surface roughness of the region of the lead LD, covered by the sealing portion MR, (the inner lead portion) is rougher than the surface roughness of the bottom surface DPb of the die pad DP. With this configuration, it is possible to improve adhesion between the lead LD and the sealing portion MR and is also possible to easily prevent the resin burrs from being left on the bottom surface DPb of the die pad DP.

Furthermore, the plating layers PL1 and PL2 are formed by plating, and therefore are high in flatness of the surfaces thereof. Accordingly, the surface roughness of the region of the top surface of the die pad DP, where the plating layer PL1 is not formed, is rougher than the surface roughness of (the top surface of) the plating layer PL1. This is the same in both the semiconductor device PKG1 of the modified example of FIG. 25 and the semiconductor device PKG of FIGS. 1 to 8. However, a difference between the surface roughness of the region of the top surface of the die pad DP, where the plating layer PL1 is not formed, and the surface roughness of the plating layer PL1 is larger in the semiconductor device PKG1 of the modified example of FIG. 25 than in the semiconductor device PKG of FIGS. 1 to 8, because a roughening treatment is performed in the semiconductor device PKG1 of the modified example of FIG. 25.

Another modified example of the semiconductor device PKG of the present embodiment is described below with reference to FIGS. 26 and 27.

Figure 26:
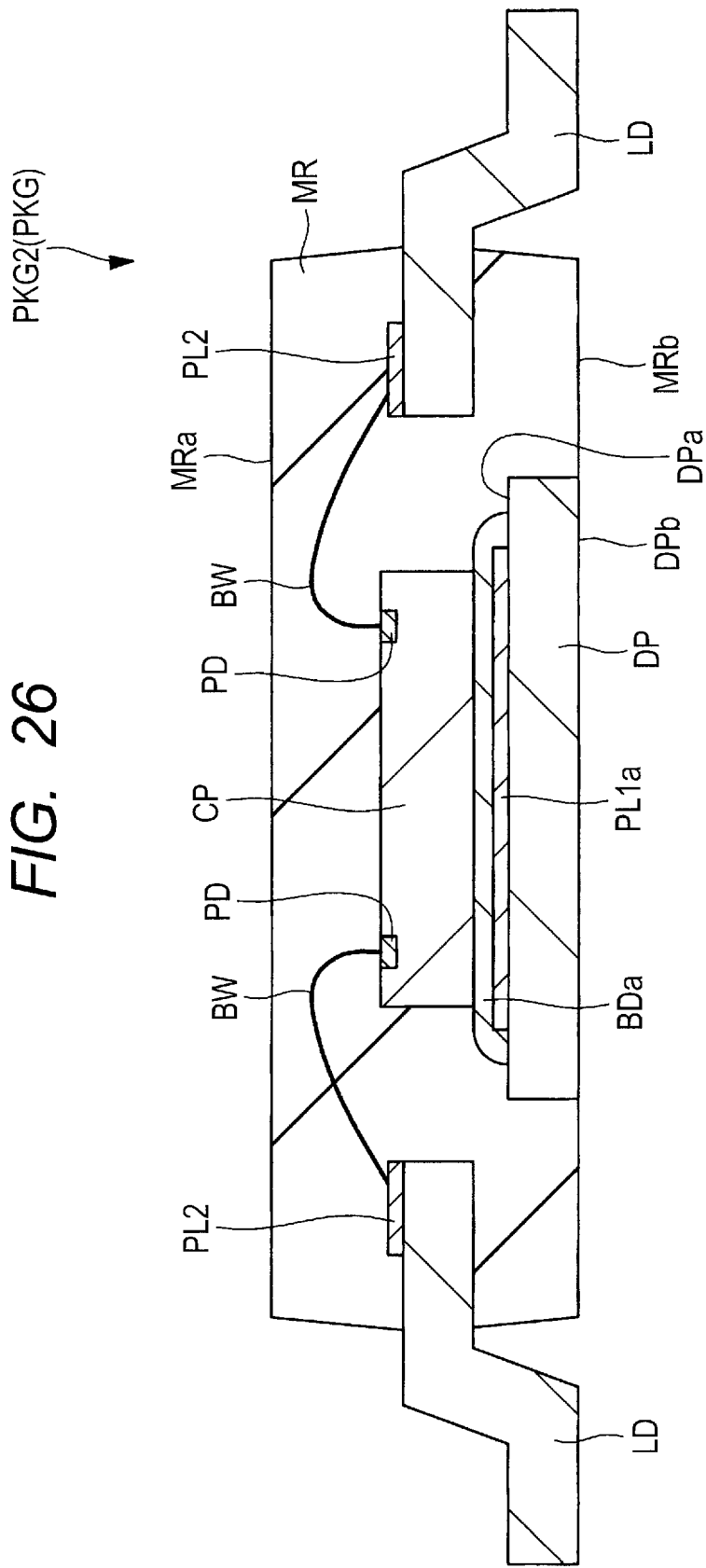
FIG. 26 is a cross-sectional view of a semiconductor device according to a modified example.

FIG. 26 is a cross-sectional view illustrating the other modified example of the semiconductor device PKG of the present embodiment, and corresponds to FIG. 7. The semiconductor device PKG of the modified example illustrated in FIG. 26 is referred to as a semiconductor device PKG2 by adding the reference sign PKG2 in the following description. FIG. 27 is a perspective plan view (a partially enlarged perspective plan view) of a portion of the semiconductor device PKG2 of FIG. 26 while the portion is enlarged, and corresponds to FIG. 8. FIG. 27 illustrates the die pad DP and its surrounding portion in the semiconductor device PKG2 while enlarging them. Further, in FIG. 27, the position (the position of the outer circumference) of the semiconductor chip CP mounted on the top surface of the die pad DP is illustrated with solid line, the position (the position of the outer circumference) of a plating layer PL1a formed on the top surface DPa of the die pad DP is illustrated with long dashed double-short dashed line, the position (the position of the outer circumference) of a bonding material BDa is illustrated with long dashed short dashed line, and the circuit forming region CC in the semiconductor chip CP is illustrated with dotted line, as in FIG. 8.

Figure 27:
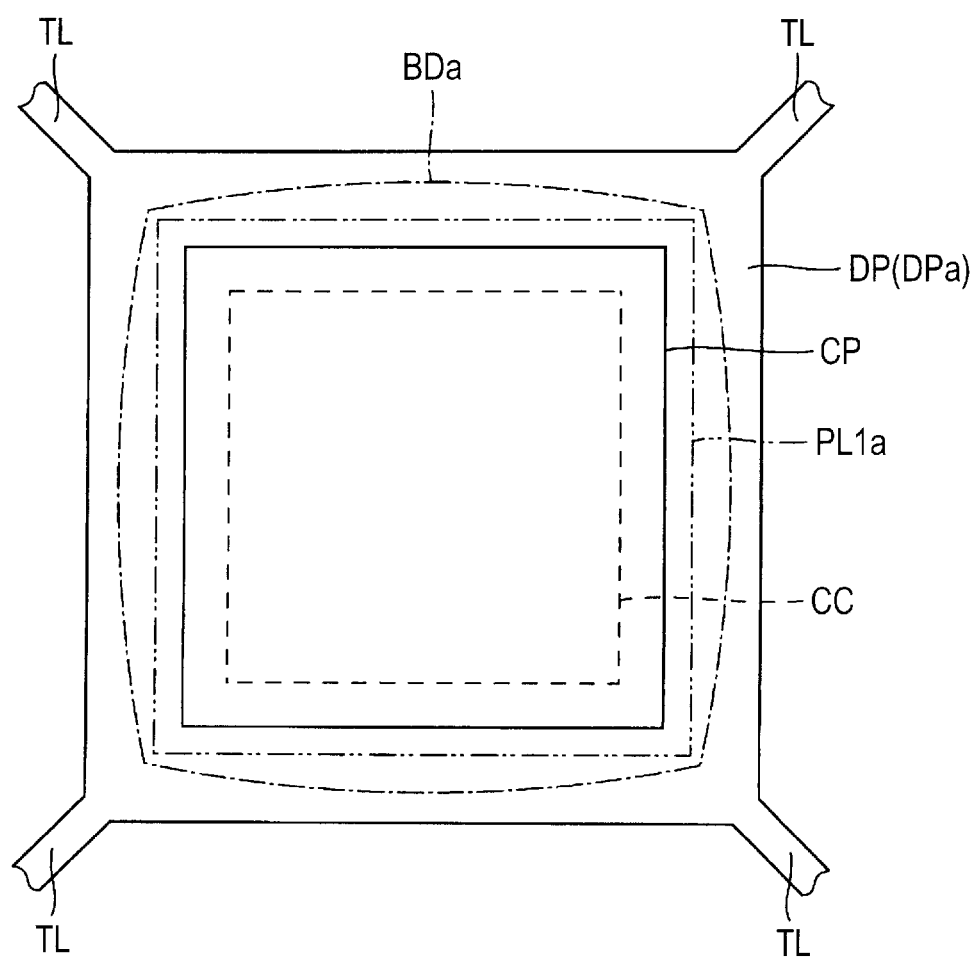
FIG. 27 is a partially enlarged perspective plan view of the semiconductor device of FIG. 26.

The semiconductor device PKG2 of the modified example illustrated in FIGS. 26 and 27 is different from the semiconductor device PKG of FIGS. 1 to 8 in a relation between the planar dimensions of the plating layer PL1a and the planar dimensions of the semiconductor chip CP.

That is, in the semiconductor device PKG2 of the modified example illustrated in FIGS. 26 and 27, the plating layer PL1a corresponding to the above plating layer PL is formed on the top surface DPa of the die pad DP. The semiconductor chip CP is mounted on the plating layer PL1a on the top surface DPa of the die pad DP via the bonding material BDa corresponding to the above bonding material BD. The plating layer PL1a is the same or similar as/to the above plating layer PL1 except for the planar dimensions (the planar area), and the bonding material BDa is the same or similar as/to the above bonging material BD except for the planar dimensions (the planar area).

In the semiconductor device PKG of FIGS. 1 to 8, the planar dimensions (the planar area) of the plating layer PL1 are smaller than the planar dimensions (the planar area) of the semiconductor chip CP, and the plating layer PL1 is included in the semiconductor chip CP in a plan view. To the contrary, in the semiconductor device PKG2 of the modified example illustrated in FIGS. 26 and 27, the planar dimensions (the planar area) of the plating layer PL1a are larger than the planar dimensions (the planar area) of the semiconductor chip CP, and the semiconductor chip CP is included in the plating layer PL1a in a plan view.

That is, the planar dimensions (the planar area) are larger in the plating layer PL1a of the semiconductor device PKG2 of the modified example illustrated in FIGS. 26 and 27 than in the plating layer PL1 of the semiconductor device PKG of FIGS. 1 to 8. While the semiconductor chip CP includes the plating layer PL1 in a plan view in the semiconductor device PKG of FIGS. 1 to 8, the plating layer PL1a includes the semiconductor chip CP in a plan view in the semiconductor device PKG2 of the modified example illustrated in FIGS. 26 and 27.

However, the semiconductor device PKG of FIGS. 1 to 8 and the semiconductor device PKG2 of the modified example illustrated in FIGS. 26 and 27 are the same in that the plating layer (PL1 or PL1a) is covered by the bonding material (BD or BDa) not to be in contact with the sealing portion MR.

Therefore, also in the semiconductor device PKG2 of the modified example illustrated in FIGS. 26 and 27, the plating layer PL1a is included in the bonding material BDa in a plan view and is entirely covered by the bonding material BDa, thereby preventing contact of the plating layer PL1a with the sealing portion MR.

Also in the semiconductor device PKG2 of the modified example illustrated in FIGS. 26 and 27, the plating layer PL1a formed on the top surface DPa of the die pad DP is entirely covered by the bonding material BDa. Therefore, a portion where the plating layer PL1a and the sealing portion MR are in contact with each other is not generated. If there is the region where the plating layer PL1a and the sealing portion MR are in contact with each other, that region can be the starting point of peeling of the sealing portion MR. However, contact between the plating layer PL1a and the sealing portion MR can be prevented because the plating layer PL1a formed on the top surface DPa of the die pad DP is entirely covered by the bonding material BDa. Therefore, it is possible to prevent a phenomenon that peeling of the sealing portion MR proceeds from the region of contact between the plating layer PL1a and the sealing portion MR as the starting point. Accordingly, the semiconductor device PKG2 of the modified example illustrated in FIGS. 26 and 27 can more suitably suppress or prevent peeling of the sealing portion MR as compared with the above second studied example of FIGS. 20 to 24, thereby improving reliability of a semiconductor device.

However, the semiconductor device PKG of FIGS. 1 to 8 is more advantageous than the semiconductor device PKG2 of the modified example illustrated in FIGS. 26 and 27 in the following points.

That is, it is easier to obtain the structure in which the plating layer (PL1 or PL1a) is entirely covered by the bonding material (BD or BDa), i.e., the plating layer (PL1 or PL1a) is not in contact with the sealing portion MR in the semiconductor device PKG of FIGS. 1 to 8 than in the semiconductor device PKG2 of the modified example illustrated in FIGS. 26 and 27.

In the die bonding process, an uncured bonding material (BD1) is pressed by the back surface of the semiconductor chip CP to spread. Therefore, after curing the bonding material (BD1), the cured bonding material BD is present below the entire back surface of the semiconductor chip CP. Accordingly, if the planar dimensions of the plating layer PL1 are set to be smaller than the planar dimensions of the semiconductor chip CP and the plating layer PL1 is designed to be included in the semiconductor chip CP in a plan view, as in the semiconductor device PKG of FIGS. 1 to 8, the entire plating layer PL1 is inevitably covered by the bonding material BD, so that contact of the plating layer PL1 with the sealing portion MR can be prevented easily and accurately.

Meanwhile, in the semiconductor device PKG2 of the modified example illustrated in FIGS. 26 and 27, only pressing of the bonding material (BD1) before being cured by the back surface of the semiconductor chip CP to spread in die bonding is not sufficient for completely covering the plating layer PL1a by the bonding material (BD1). Therefore, in the semiconductor device PKG2 of the modified example illustrated in FIGS. 26 and 27, it is necessary to contrive a process of supplying (applying) the bonding material (BD1) for die bonding onto the die pad DP (the plating layer PL1a) in such a manner that the plating layer PL1a is completely covered by the bonding material BDa. For example, when a conductive paste type bonding material (BD1), such as silver (Ag) paste, is supplied (applied) onto the top surface DPa (the plating layer PL1a) of the die pad DP, a contrivance, such as increase of the supplied amount (the applied amount) of the silver (Ag) paste or increase the number of nozzles from which silver (Ag) paste is discharged, is performed, so that the plating layer PL1a is completely covered by the bonding material BDa.

Therefore, the semiconductor device PKG of FIGS. 1 to 8, in which the plating layer PL1 is included in the semiconductor chip CP in a plan view, can obtain the structure in which the plating layer PL1 is entirely covered by the bonding material BD and is not in contact with the sealing portion MR more easily and more accurately, as compared with the semiconductor device PKG2 of the modified example illustrated in FIGS. 26 and 27. Accordingly, the semiconductor device PKG of FIGS. 1 to 8 can improve reliability of a semiconductor device more, can improve the manufacturing yield of the semiconductor device more, and can make management of the manufacturing process of the semiconductor device easier, as compared with the semiconductor device PKG2 of the modified example illustrated in FIGS. 26 and 27.

In addition, in the semiconductor device PKG2 of the modified example illustrated in FIGS. 26 and 27, it is necessary to increase the amount of silver (Ag) paste (the bonding material BD1) supplied (applied) onto the top surface DPa of the die pad DP (the plating layer PL1a). This causes increase of the manufacturing cost of the semiconductor device. Therefore, the semiconductor device PKG of FIGS. 1 to 8 is more advantageous than the semiconductor device PKG2 of the modified example illustrated in FIGS. 26 and 27 also from a viewpoint of suppressing the manufacturing cost of the semiconductor device.

Furthermore, in the semiconductor device PKG2 of the modified example illustrated in FIGS. 26 and 27, it is effective to increase the number of nozzles from which silver (Ag) paste is discharged when the silver (Ag) paste (the bonding material BD1) is supplied (applied) onto the top surface DPa of the die pad DP (the plating layer PL1a). However, in order to increase the number of the nozzles, it is necessary to change a manufacturing apparatus (a silver paste application apparatus). On the other hand, in the semiconductor device PKG of FIGS. 1 to 8, it is possible to supply (apply) silver (Ag) paste (the bonding material BD1) onto the top surface DPa of the die pad DP (the plating layer PL1) by using a commonly used manufacturing apparatus (silver paste application apparatus). Also from this viewpoint, the semiconductor device PKG of FIGS. 1 to 8 is more advantageous than the semiconductor device PKG2 of the modified example illustrated in FIGS. 26 and 27.

In the above, the invention made by the inventors of the present application has been specifically described by way of the embodiment. However, it is naturally understood that the present invention is not limited to the aforementioned embodiments, and can be changed in various ways within the scope not departing from the gist thereof.

What is claimed is:

1. A semiconductor device comprising:
   a die pad having a main surface, a first plating layer formed on the main surface, and a back surface opposite the main surface;
   a semiconductor chip having a front surface, a plurality of electrode pads formed on the front surface, and a rear surface opposite the front surface, and mounted on the main surface of the die pad via a first bonding material such that a first region of the main surface of the die pad is exposed from the semiconductor chip in plan view;
   a plurality of leads arranged around the semiconductor chip in plan view, each of the plurality of leads having an upper surface on which a second plating layer is partially formed, and a lower surface opposite the upper surface;
   a plurality of wires electrically connecting the plurality of electrode pads of the semiconductor chip with the plurality of leads, respectively, via the second plating layer; and
   a sealing body sealing the semiconductor chip, at least a portion of the die pad, the plurality of wires and at least a portion of each of the plurality of leads,
   wherein each of the die pad and the plurality of leads is made of a metal material mainly containing copper,
   wherein each of the first plating layer and the second plating layer is made of one of silver, gold or platinum,
   wherein the first plating layer is covered with the semiconductor chip such that the first plating layer is not exposed from the semiconductor chip in plan view,
   wherein the first plating layer is covered with the first bonding material such that the first plating layer is not in contact with the sealing body,
   wherein the semiconductor chip has a circuit forming region in which a plurality of semiconductor integrated circuits are formed, and
   wherein the semiconductor chip is mounted on the die pad such that the circuit forming region of the semiconductor chip is located within an area in which the first plating layer is formed in plan view.

2. The semiconductor device according to claim 1, wherein an area of the first plating layer is equal to or more than 70% of an area of the semiconductor chip in a plan view.

3. The semiconductor device according to claim 1, wherein the first bonding material is formed of a conductive bonding material containing a conductive material and a resin material.

4. The semiconductor device according to claim 1, wherein the first bonding material is formed of a sintered metal.

5. The semiconductor device according to claim 1, wherein the back surface of the die pad is exposed from the sealing body.

6. The semiconductor device according to claim 1, wherein the first region of the main surface of the die pad, in which no plating layer is formed, has a surface roughness rougher than a surface roughness of the first plating layer.

7. The semiconductor device according to claim 6, wherein the first region of the main surface of the die pad, in which no plating layer is formed, has the surface roughness rougher than a surface roughness of a second region of each of the plurality of leads, which is exposed from the sealing body.

8. The semiconductor device according to claim 1, wherein a region of the die pad, which is in contact with the sealing body, is roughened.

9. The semiconductor device according to claim 1, wherein the first plating layer is a sliver layer.

* * * * *